US009209044B2

(12) United States Patent
Kajiwara et al.

(10) Patent No.: US 9,209,044 B2
(45) Date of Patent: Dec. 8, 2015

(54) METAL-RESIN COMPOSITE, METHOD FOR PRODUCING THE SAME, BUSBAR, MODULE CASE, AND RESINOUS CONNECTOR PART

(75) Inventors: Ryoichi Kajiwara, Hitachi (JP); Shigehisa Motowaki, Mito (JP); Yusuke Asaumi, Hitachi (JP)

(73) Assignee: HITACHI, LTD., Tokyo (JP)

( * ) Notice: Subject to any disclaimer, the term of this patent is extended or adjusted under 35 U.S.C. 154(b) by 621 days.

(21) Appl. No.: 13/308,586

(22) Filed: Dec. 1, 2011

(65) Prior Publication Data
US 2012/0141818 A1 Jun. 7, 2012

(30) Foreign Application Priority Data

Dec. 1, 2010 (JP) .................................. 2010-268582

(51) Int. Cl.
| H01L 21/56 | (2006.01) |
| H01L 23/049 | (2006.01) |
| H01L 23/24 | (2006.01) |
| H01L 23/29 | (2006.01) |
| H01L 23/373 | (2006.01) |
| H01L 23/31 | (2006.01) |

(52) U.S. Cl.
CPC .............. *H01L 21/56* (2013.01); *H01L 23/049* (2013.01); *H01L 23/24* (2013.01); *H01L 23/296* (2013.01); *H01L 23/3735* (2013.01); *H01L 23/3142* (2013.01); *H01L 2224/45124* (2013.01); *H01L 2224/48091* (2013.01); *H01L 2224/48472* (2013.01); *H01L 2224/73265* (2013.01); *H01L 2924/13055* (2013.01); *H01L 2924/19107* (2013.01); *H01L 2924/30107* (2013.01); *Y10T 428/12458* (2015.01); *Y10T 428/12472* (2015.01)

(58) Field of Classification Search
None
See application file for complete search history.

(56) References Cited

U.S. PATENT DOCUMENTS 3,857,681 A * 12/1974 Yates et al. .................... 428/554
2008/0261020 A1 10/2008 Kawaguchi et al.
(Continued)

FOREIGN PATENT DOCUMENTS

CN 101842518 A 9/2010
EP 1 944 389 A1 7/2008
(Continued)

OTHER PUBLICATIONS

Notice of Reasons for Rejection of JP Appln. No. 2010-268582 dated Oct. 29, 2013 with English translation.
(Continued)

*Primary Examiner* — Mark Ruthkosky
*Assistant Examiner* — Daniel J Schleis
(74) *Attorney, Agent, or Firm* — Baker Botts L.L.P.

(57) ABSTRACT

Provided are a metal-resin composite having excellent adhesive strength, a method for producing the same, a busbar, a module case, and a resinous connector part. The metal-resin composite comprises a metallic member 1 including a metal with a high melting point of 500° C. or more, a resin member 2 being integrated with the metallic member 1; and an alloy layer 3 including a metal with a low melting point lower than 500° C. The alloy layer 3 is arranged between the metallic member 1 and the resin member 2, and has average surface roughness thereof in the range from 5 nm or more to less than 1 μm at the interface between the alloy layer 3 and the resin member 2. Herein, a period of the unevenness formed on the interface of the alloy layer 3 is in the range from 5 nm or more to less than 1 μm.

6 Claims, 14 Drawing Sheets

(56) References Cited

U.S. PATENT DOCUMENTS

2010/0297465 A1 11/2010 Nishihara et al.
2011/0111214 A1 5/2011 Endo et al.

FOREIGN PATENT DOCUMENTS

| EP | 2 226 185 A1 | 9/2010 |
|---|---|---|
| JP | 63-160367 | 7/1988 |
| JP | 02-285662 | 11/1990 |
| JP | 09-148508 | 6/1997 |
| JP | 2001-047462 A | 2/2001 |
| JP | 2002-076226 | 3/2002 |
| JP | 2004-034524 A | 2/2004 |
| JP | 2006-239961 A | 9/2006 |
| JP | 2008-186955 | 8/2008 |
| JP | 2009-298144 | 12/2009 |
| JP | 2010-007130 | 1/2010 |
| WO | WO 2004/048087 A1 | 6/2004 |
| WO | WO 2005/091441 | 9/2005 |
| WO | WO 2009/151099 A1 | 12/2009 |

OTHER PUBLICATIONS

Chinese office action of Appln. No. 201110389433.7 dated Dec. 20, 2013.
EP Office Action of Appln. No. 11 191 289.5 dated Jul. 11, 2013 in English.
EP Search Report of Appln. No. 11191289.5 dated Oct. 31, 2012 in English.

* cited by examiner

10 Metal-Resin Composite
2 Resin Member
3 Alloy Layer
1 Metallic Member

Method of Shearing Test

METAL-RESIN COMPOSITE, METHOD FOR PRODUCING THE SAME, BUSBAR, MODULE CASE, AND RESINOUS CONNECTOR PART

CROSS REFERENCE TO RELATED APPLICATIONS

This application claims the foreign priority benefit under Title 35, United State Code, 119 (a)-(d) of Japanese Patent Application No. 2010-268582, filed on Dec. 1, 2010 in the Japan Patent Office, the disclosure of which is herein incorporated by reference in its entirety.

BACKGROUND OF THE INVENTION

1. Field of the Invention

The present invention relates to a metal-resin composite, a method for producing the metal-resin composite, a busbar, a module case, and a resinous connector part.

2. Description of Related Art

In the viewpoint of weight saving and protection of mechanism elements and electronic parts against severe usage environment, for example, many elements and parts using a resin are widely utilized as the elements and parts used for an automotive field. Generally, such an element and a part have a structure that a metallic member is integrated with a resin member, and are required to have high reliability for resisting a long-term usage, especially, to maintain adhesive strength between a metallic member and a resin member under high humidity and high temperature environment. In other words, a high adhesive property between the metallic member and the resin member has been demanded as a very important theme.

Such a method for highly adhering has been known, comprising the steps of roughening a surface of a metallic member and increasing an adhesive property thereof by the anchor effect. For example, the Japanese Laid-Open Patent Publication No. S63-160367 describes that a lead frame made of an iron-nickel alloy at a resin sealing part is electroplated with a tin-nickel alloy so as to have a plating thickness within the range from 10 to 15 µm and surface roughness within the range from 2 to 5 µm. Further, the Japanese Laid-Open Patent Publication No. H9-148508 describes that the whole surface of a lead frame body is electrolytically treated using the current density more than the critical current density in an electrolytic solution containing a specific metal ion thereby to form a rough layer, and further electrolytically treated using the current density less than the critical current density in an electrolytic solution containing a specific metal ion thereby to form a covering layer.

Further, as a method for highly adhering by roughening a surface through an etching process, such a method for adhering with high-intensity has been known, comprising the steps of etching copper or aluminum material in an aqueous solution containing water-soluble reduction agents such as iron (II) chloride or hydrazine or the like so as to roughen the surface of the metallic material, and having the resultant metallic material adhere to the resin member with high-intensity by the anchor effect.

However, the techniques disclosed in the Japanese Laid-Open Patent Publication Nos. S63-160367 and H9-148508 have the following drawbacks. That is, in the technique of the Japanese Laid-Open Patent Publication No. S63-160367, the surface roughness of the lead frame is relatively rough in the degree of several µm, which may require a plating thickness of 10 µm or more. Hereby, there are drawbacks that this technique may elongate the plating time thereby to reduce the productivity, or need the quite often supplement of a plating solution thereby to increase the production cost. Particularly, since the lead frame described in the Japanese Laid-Open Patent Publication No. S63-160367 contains iron, if such an iron based material is to be plated, the pre-treatment such as removal of grease and an oxidation film on the surface of the metallic member may have to be conducted, prior to the plating process. In other words, if such a pre-treatment is not conducted or insufficiently conducted, or if the surface of the metallic member is to be exposed to the air after the pre-treatment, the adhesive ability of the plating film formed after the plating process to the metallic member may decrease, resulting in probability that the plating film peels.

Further, in the technique described in the Japanese Laid-Open Patent Publication No. H9-148508, for example, if the metallic member contains a plurality of metal types, the optimal pre-treatment solution for forming a roughening layer and a covering layer is different depending on the metal types, resulting in difficulties in uniformly treating the surface of the metallic member. Therefore, the adhesive strength may be lowered corresponding to the regions of the surface of the metallic member. Moreover, the technique disclosed in the Japanese Laid-Open Patent Publication No. H9-148508 may have a drawback that the roughness layer or the covering layer may peel off, depending on whether the pre-treatment is performed or not, similarly to the drawback of the technique disclosed in the Japanese Laid-Open Patent Publication No. S63-160367.

Further, a method for highly adhering by roughening a surface through an etching process comprises a step of scraping off the surface of the metallic member by the etching process, which results in difficulties in improving the dimensional accuracy of the surface of the metallic member. Furthermore, the plating film may be removed in the etching process. Herein, since the etching solutions are different depending on the metal types, if the metallic member includes a plurality of metal types, this makes it difficult to uniformly treat the surface, similarly to the technique disclosed in the Japanese Laid-Open Patent Publication No. H9-148508, resulting in probability of creating regions where the adhesive strength lowers. Further, the surface of the metallic member thus obtained after the etching process becomes the ground metallic member itself. Accordingly, the metal types capable of improving the adhesive property by using the chemical interaction between the metallic member and the resin member may not be efficiently utilized.

SUMMARY OF THE INVENTION

The present invention has been investigated to solve the above mentioned drawbacks. Therefore, an object of the present invention is to provide a metal-resin composite having excellent adhesive strength, a method for producing the metal-resin composite, a busbar, a module case, and a resinous connector part.

The present inventors have earnestly investigated to solve the above mentioned drawbacks. Accordingly, the present inventors find a solution of the above mentioned drawbacks by making the surface of the metallic member have a specific range of surface roughness and a period of unevenness, thereby to accomplish the present invention.

According to the present invention, a metal-resin composite having excellent adhesive strength, a method for producing the metal-resin composite, a busbar, a module case, and a resinous connector part may be provided.

BRIEF DESCRIPTION OF THE DRAWINGS

FIG. 13A is a photograph of the cross-section of the nickel plated metal-resin composite in Example 1, taken by a scanning electron microscope. FIG. 13B is a photograph of the magnified cross-sectional region in the vicinity of the interface between the resin member and the alloy layer in FIG. 13A taken by a scanning electron microscope.

FIG. 16A is a photograph of the cross-section of the nickel plated metal-resin composite in Example 2, taken by a scanning electron microscope. FIG. 16B is a photograph of the cross-section of the metal-resin composite after the heating process, taken by a scanning electron microscope.

DETAILED DESCRIPTION OF THE PREFERRED EMBODIMENT

Hereinafter, will be explained in detail the aspects for carrying out the present invention (hereinafter, appropriately referred to as a "present embodiment"). However, the present invention is not limited to the contents described hereinafter, and any various modifications may be performed without apart from the scope of the present invention.

[1. Metal-Resin Composite]

Figure 1:
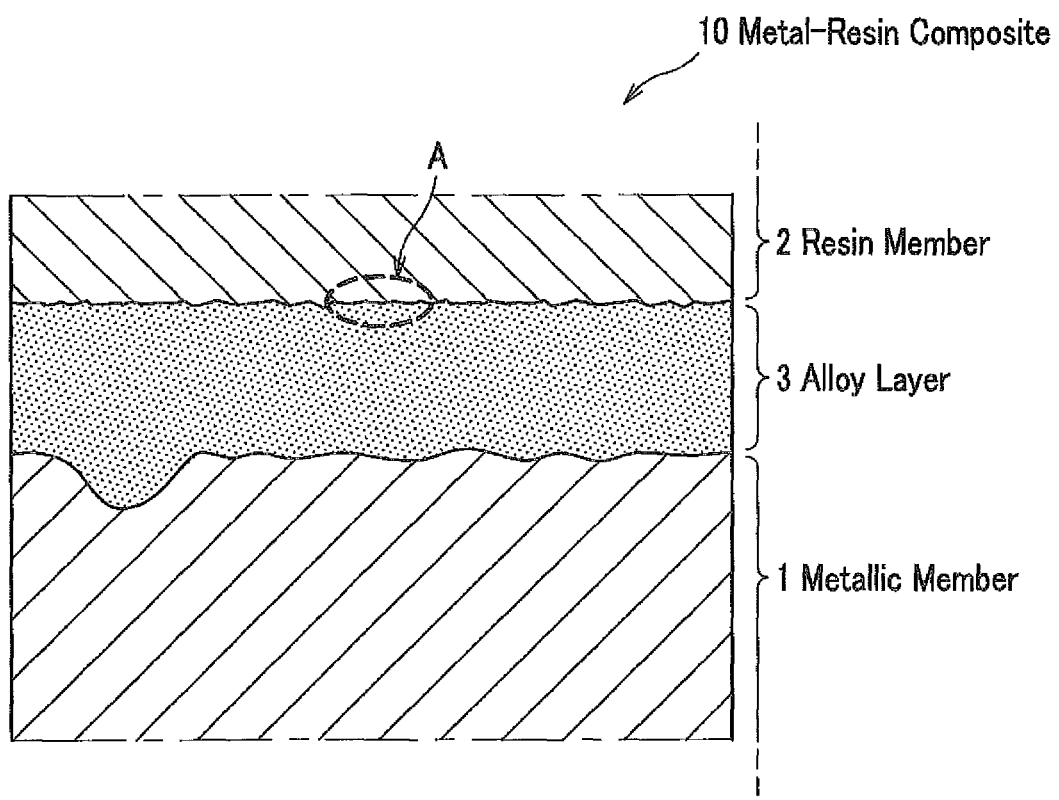
FIG. 1 is a schematic diagram showing a cross-section of a metal-resin composite in the present embodiment.

FIG. 1 is a diagram schematically showing a cross-section of a metal-resin composite 10 in the present embodiment. That is, the metal-resin composite 10 of the present embodiment comprises a metallic member 1 including a metal with a high melting point of 500° C. or more, a resin member 2 integrated with the metallic member 1, and an alloy layer 3 including a metal of a low melting point less than 500° C., arranged between the metallic member 1 and the resin member 2. Further, the average surface roughness of the alloy layer 3 is in the range form 5 nm or more to less than 1 μm, and the period of the unevenness formed on the interface of the alloy layer 3 is in the range from 5 nm or more to less than 1 μm.

[1-1. Metallic Member 1]

A metal contained in the metallic member 1 of the metal-resin composite 10 in the present embodiment has a melting point of 500° C. or more (such a metal is referred to as a "metal with (or having) a high melting point" in the present invention). The amount of the metal of a high melting point contained in the metallic member 1 is not particularly limited. However, all of the metals contained in the metallic member 1 are preferably metals with high melting points.

As a metal with a high melting point, any metals may be used as long as the melting point thereof is 500° C. or more. Of those metals, aluminum, copper, nickel, and iron are preferably used. Note the metal with a high melting point may be used alone, or two or more types of metals may be used at any rate or in any combination thereof.

[1-2. Resin Member 2]

A resin member 2 of the metal-resin composite 10 in the present embodiment is arranged on the surface of the alloy layer 3 described hereinafter. A type of resin composing of the resin member 2 (or a polymer resin) is not particularly limited, for example, a thermosetting resin and a thermoplastic resin or the like may be used. More specifically, such a resin includes an epoxy resin, a melamine resin, a urea resin, a phenol resin, an alkyd resin; commodity plastics such as polyethylene, polypropylene and acrylic resins; engineering plastics such as polyamide, polycarbonate, polybutylenetelephthalate and polyethylenetelephthalate or the like; super engineering plastics such as polyphenylene sulfide, a liquid crystal polymer, polyether ether ketone or the like. As a resin composing of the resin member 2, are preferably the above mentioned resins. The usage of the above mentioned resins allow the metal-resin composite to have particularly high adhesive reliability between the resin member 2 and the alloy layer 3. Note the resin composing of the resin member 2 may be used alone as a single type thereof, or two or more types of resins may be used at any rate and in any combination thereof.

It should be noted that when a thermoplastic resin is used as the resin member 2, for example, the injection molding may be conducted to form the resin member 2. However, in such a case, when the temperature of the mold is low, the viscosity of the thermoplastic resin is higher than that of the thermosetting resin, which prevents the thermoplastic resin from penetrating microfine recesses located on the surface of the alloy layer 3, thereby to decrease the adhesive strength in some cases. Accordingly, if it is the case, for example, the increase in the mold temperature of 160° C. or more and the increase in the injection pressure of 90 MPa or more allow the resin member 2 to be formed without decreasing the adhesive strength thereof.

[1-3. Alloy Layer 3]

An alloy layer 3 of the metal-resin composite 10 in the present embodiment is arranged between the metallic member 1 and the resin member 2, and contains a metal with a melting point less than 500° C. (such a metal is referred to as "a metal with (or having) a low melting point" in the present invention). The metal with a low melting point contained in the alloy layer 3 is not particularly limited. However, zinc, tin, indium, and bismuth are preferable, in the viewpoints of a particularly little effect on the human body together with a particularly easy operation of alloying a metal with the metal having a high melting point composing of the metallic member 1. Note the metal with a low melting point may be used alone, or two or more types of metals may be included at any rate and in any combination thereof.

In the metal-resin composite 10 of the present embodiment, the metal with a high melting point included in the metallic member 1 has a melting point of 500° C. or more, while the metal with a low melting point included in the alloy layer 3 has a melting point less than 500° C. The reason is that when the metal-resin composite 10 is used, for example, as automotive parts, the metal-resin composite 10 is to be exposed in the environment at the maximum temperature of about 300° C. In other words, if the metallic member 1 is destroyed (or melted) at the degree of the temperature of 300° C., the reliability of the metal-resin composite 10 (or the adhesive property of the resin member 2) turns to be damaged. Therefore, in order to secure the high reliability under such environment, the metal having a melting point of 500° C. or more is used as a metallic member with a high melting point. Herein, it is construed that the alloy layer 3 may be broken, if the melting point of the metal having a low melting point is lower than 300° C. However, when the metal-resin composite 10 in the present embodiment is produced (as described in detail hereinafter), the metal having a high melting point included in the metallic member 1 alloys with the metal having a low melting point included in the alloy layer 3, resulting in the great rising in the melting point of the whole alloy layer 3. Accordingly, even if the metal-resin composite 10 is exposed under the above mentioned hard environment, the melting of the metal having a low melting point may be ignored, resulting in exerting no bad influence on the reliability of the metal-resin composite 10.

A content of the metal with a low melting point included in the alloy layer 3 is not specifically limited. However, generally the content is 5 atomic % or more, preferably 10 atomic % or more, and preferably 90 atomic % or less. If the content is too small, the heat-treatment time at the production may become too long, or the chemical interaction of the alloy with the resin member 2 may be lowered, which may result in the decrease in the adhesive property. Alternatively, if the content of the metal is too large, the heat-resistant property and the anti-corrosion property of the metal-resin composite 10 turn to decrease, which may result in the decrease in the reliability of the metal-resin composite 10 under the high humidity and high temperature environment.

A thickness of the alloy layer 3 is not specifically limited. However, preferably the thickness is 0.1 µm or more to generally 20 µm or less, preferably 10 µm or less. If the alloy layer 3 is too thin, the adhesive property of the resin member 2 may become insufficient, while if the alloy layer is too thick, the heat-treatment time may turn to be too long at the production of the metal-resin composite 10.

Further, in the metal-resin composite 10 in the present embodiment, when the alloy layer 3 is halved into two parts in the parallel direction of the interface between the resin member 2 and the alloy layer 3, the amount of the metal with a low melting point included at the interface side of the resin member 2 is larger than the amount of the metal with a low melting point included at the interface side of the metallic member 1. Herein, the concentration of the metal with a low melting point included at the interface side of the metallic member 1 continuously changes. Such a phenomenon shows that when the metal with a high melting point included in the metallic member 1 diffuses into the alloy layer 3, the longer the distance from the metallic member 1 becomes, the more the degree of the diffusion thereof decreases, when the metal-resin composite 10 is produced. Hereby, the above mentioned structure of the alloy layer 3 allows more reliable adhesive property of the resin member 2 to be secured.

Figure 2:
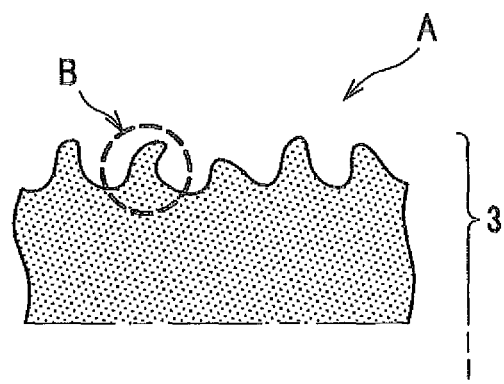
FIG. 2 is a magnified diagram of the part A in FIG. 1

FIG. 2 is a magnified diagram of the part A in FIG. 1, schematically showing the area in the vicinity of the interface between the resin member 2 and the alloy layer 3. As shown in FIG. 2, the shape of the alloy layer 3 on the interface between the resin member 2 and the alloy layer 3 is rough (that is, the shape comprises the unevenness). More specifically, on the interface between the resin member 2 and the alloy layer 3, the average surface roughness of the alloy layer 3 is in the rage from 5 nm or more to less than 1 µm, and the period of the unevenness formed on the interface of the alloy layer 3 is in the rage from 5 nm or more to less than 1 µm.

Figure 3:
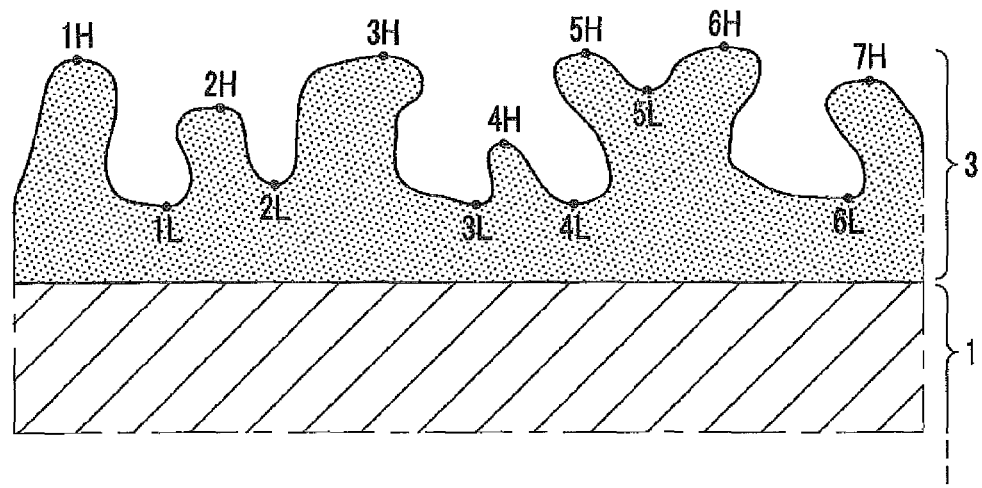
FIG. 3 is a diagram explaining average surface roughness and a period of unevenness of the metal-resin composite in the present embodiment.

Here, will be explained the "average surface roughness" and the "period of the unevenness" in the present invention referring to FIG. 3. FIG. 3 is a diagram explaining the average surface roughness and the period of the unevenness of the metal-resin composite 10 in the present embodiment. As shown in FIG. 3, the "average surface roughness" is defined by measuring a height difference between the adjacent peak heights of the upper protrusion part (shown as nH) and the lower recess part (shown as nL), using the surface of the metallic member 1 as a datum plane, and calculating an average value of the height differences as the average surface roughness. In such a case, if the height difference between the adjacent peak heights is equal to or less than 2 nm (or nanometer), the value thus obtained is not used for the calculation. In other words, the average surface roughness of the present invention is defined in the following equation (1). Herein, x is an optional integer in the following equation (1). Further, each peak height may be measured by taking a photograph of the cross-section of the metal-resin composite 10 by a scanning electronic microscope (or SEM), and calculating the height using image analysis software for the photograph thus obtained.

$$\text{Average Surface Roughness} = \sum_{n=1}^{n=x} \left\{ \frac{nH - nL + (n+1)H - (n+1)L}{2n} \right\} \quad (1)$$

On the other hand, the "period of the unevenness" is defined by calculating an average value of every distance from the above mentioned upper protrusion part to the adjacent upper protrusion part. The investigation of the present inventors has elucidated that the average surface roughness strongly correlates with the period of the unevenness, revealing that the period of the unevenness is usually in the range of ½- to 2-fold of the average surface roughness.

Accordingly, the average surface roughness and the period of the unevenness measured based on the above mentioned definition show that the average surface roughness of the alloy layer 3 is in the rage from 5 nm or more to less than 1 µm and the period of the unevenness formed on the interface of the alloy layer 3 is in the rage from 5 nm or more to less than 1 µm. Herein, if the average surface roughness is shorter than 5 nm, the resin composing of the resin member 3 falls into difficulties for penetrating in the inside of the protrusions and recesses located on the surface of the alloy layer 3, which may result in decrease in the adhesive strength. Therefore, when the average surface roughness and the period of the unevenness are set within the aforementioned range, this allows a mechanical anchor effect to be achieved, whereby a metal-resin composite having high reliability (that is, having high adhesive strength) may be obtained.

Figure 4:
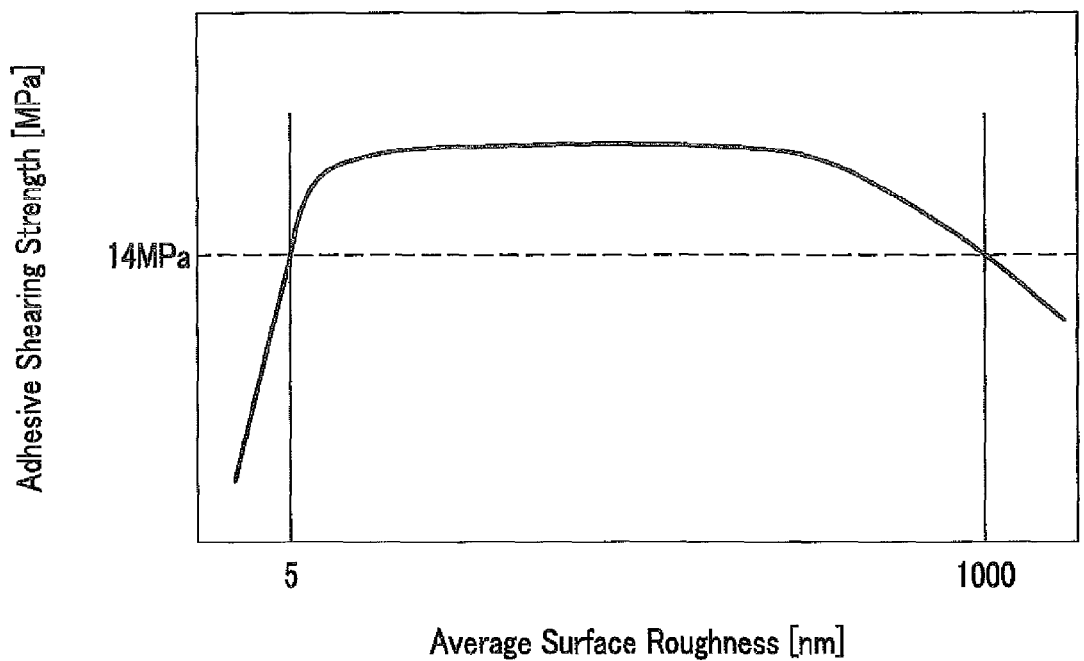
FIG. 4 is a graphic diagram showing a relationship between average surface roughness and adhesive shearing strength, in the metal-resin composite.

After all, the investigation of the present inventors resulted in the acquirement of a graph showing the relationship between the average surface roughness and the adhesive shearing strength shown in FIG. 4. As shown in FIG. 4, it was observed that penetration of the resin into the alloy layer 3 became insufficient due to too small size of each recess part located on the alloy layer 3 at the region where the average surface unevenness was less than 5 nm. Further, it was also observed that a catching-in ability by the anchor effect turned to be weaker due to lower overhanging level of each overhang shape, resulting in insufficiency of the adhesive strength. Further, it was also observed that when the average surface roughness was 1 μm or more, even though the unevenness might be formed, the overhang shapes turned to be hardly formed, resulting in difficulties for exerting the sufficient anchor effect, whereby the adhesive strength became insufficient. The above mentioned results led the average surface roughness to be in the range from 5 nm or more to less than 1 μm in the present embodiment.

Accordingly, as mentioned above, when the average surface roughness is less than 5 nm, the level of the overhanging turns to be lower, which may make the catching-in ability of the resin member 2 weaker, thereby to probably decrease the adhesive strength. Alternatively, when the average surface roughness is 1 μm or more, even though the unevenness may be formed, the overhang shape desirable as the unevenness shape turns to be hardly obtained. This results in difficulties for exerting the anchor effect, also probably leading to the lowering of the adhesive strength.

Figure 5A:
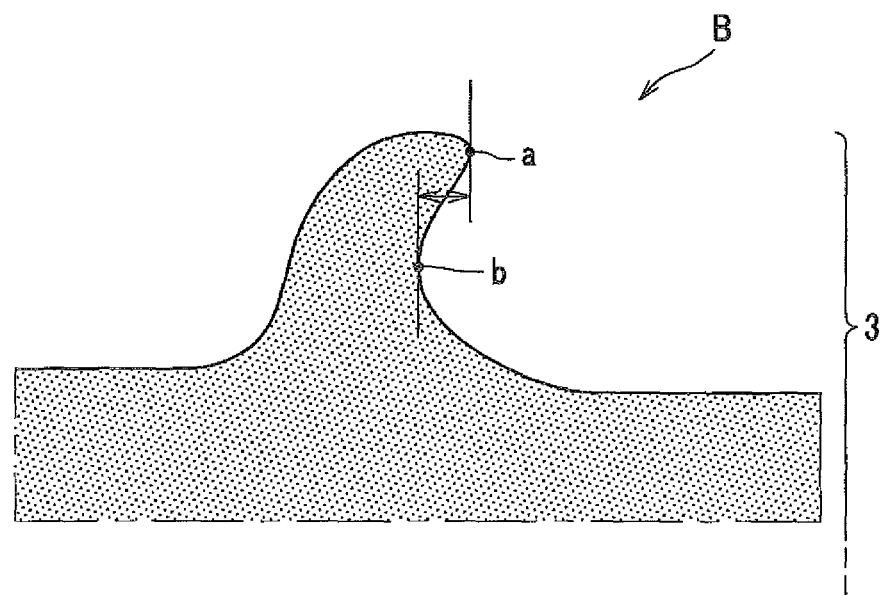
FIG. 5A is a magnified diagram of the part B in FIG. 2, explaining overhang shapes of the metal-resin composite in the present embodiment.
Figure 5B:
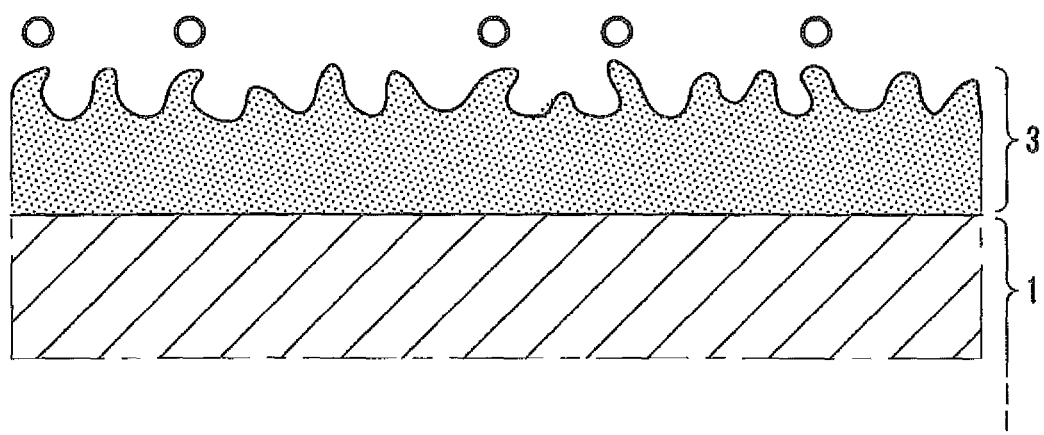
FIG. 5B is a diagram explaining the density of the overhang shapes of the metal-resin composite in the present embodiment.

Next, referring to FIGS. 5A and 5B, the above mentioned "overhang shape" will be explained. FIG. 5A is a magnified diagram of the part B in FIG. 2, explaining the overhang shape in the metal-resin composite 10 in the present embodiment. FIG. 5B is a diagram explaining the density of the overhang shapes in the metal-resin composite 10 in the present embodiment.

As shown in FIG. 5A, the "overhang shape" means a structure in which a recess part "b" exists in the lower portion against a protrusion part "a" in the upper portion, when vertical lines are set up on the surface of the metallic member 1. Herein, the longer a distance between the vertical line passing through the protrusion part "a" and the vertical line passing through the recess part "b" (that is, the width in the crosswise direction shown as an arrow in FIG. 5A) becomes, the easier the resin member 2 may be caught in, resulting in more increase in the adhesive strength.

Further, the "overhang density" means the number of the upper protrusion parts each having an overhang shape located per 1 μm in the parallel direction of the interface between the metallic member 1 and the alloy layer 3. For example, if the length in the crosswise direction of the alloy layer 3 shown in FIG. 5B is 1 μm, the resulting overhang density becomes five pieces/1 μm.

As mentioned hereinbefore, the overhang shape is preferable as the shape of the unevenness formed on the interface between the resin member 2 and the alloy layer 3 in the metal-resin composite 10 in the present embodiment. Accordingly, with respect to the metal-resin composite 10 in the present embodiment, preferably at least a part of the shapes in the aforementioned unevenness have the overhang shapes, and one or more overhang shapes are formed per 1 μm in the parallel direction of the interface. The above mentioned structure allows the anchor effect to be more increased, and the adhesive strength to be more surely improved.

Figure 6:
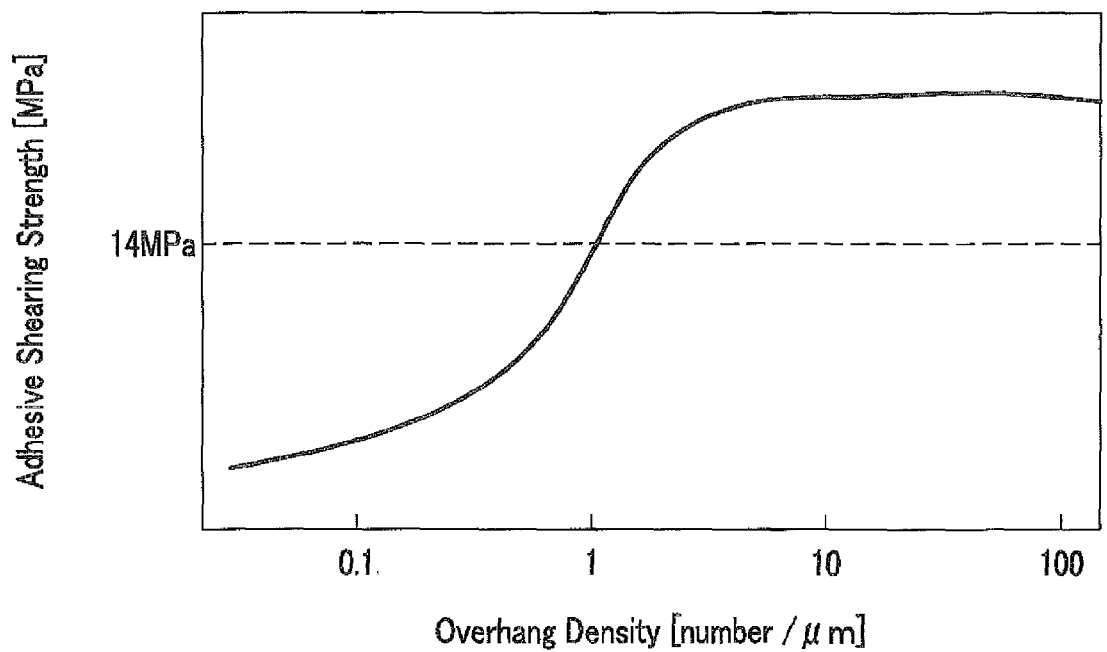
FIG. 6 is a graphic diagram explaining a relationship between the overhang density and the adhesive shearing strength in the metal-resin composite.

The investigation of the inventors elucidated the relationship between the overhang density and the adhesive shearing strength shown in FIG. 6. As shown in FIG. 6, the higher the overhang density increases, the stronger the adhesive shearing strength changes. Hereby, if so-called fracture inside the resin occurs, for example, fracture inside the resin member 2 occurs, the adhesive shearing strength shows a tendency to be saturated as a plateau. Therefore, the inventors considered that an epoxy resin had a fraction rate inside the resin in 80% or more at the adhesive shearing strength of 14 MPa or more, based on the example in which nickel was used as a metal with a high melting point and an epoxy resin was used as a resin material. This consideration led to the adhesive shearing strength of 14 MPa or more and the over hang density of 1 piece/μm, as the preferable lowest values in the metal-resin composite in the present embodiment.

[1-4. Effects]

Regarding the metal-resin composite 10 in the present embodiment, the metallic member 1 adheres to the resin member 2 via the alloy layer 3 of which average surface roughness and the period of the unevenness are set within the specific range. That arrangement of the alloy layer 3 allows the adhesive strength to the resin member 2 to be improved without depending on the included metal types, even though the metallic member 1 includes a plurality of metal types. Such an effect is exerted mainly by facilitating the wettability of the interface between the alloy included in the alloy layer 3 and the resin member 2 through the chemical interaction thereof. That adhesive strength is firmer than the physical adsorption.

Further, the unevenness arranged such that the surface of the alloy layer 3 has the specific average surface roughness and the specific period of the unevenness, enables the adhesive effect to be enhanced by increasing the contact area between the alloy included in the alloy layer 3 and the resin member 2. Further, the unevenness also allows the initial adhesive strength to the resin member 2 to be increased more than the strength of causing the fracture inside the resin without depending on the material types of the metallic member 1. Moreover, the mechanical anchor effect allows the adhesive strength between the alloy layer 3 and the metallic member 1 to be greatly improved. Hereby, even if the metal-resin composite is used at the place to which a strong external force is applied, or is used in the severe environment under the high humidity and the high temperature or the like, the metal-resin composite 10 may secure the high reliability with no peeling of the resin member 2 from the metallic member 1. Further, the adhesive part formed by the aforementioned anchor effect is different from the adhesive part formed by the chemical interaction, which prevents the adhesive strength from being affected by the penetration of moisture, allowing the high reliability to be secured.

[2. Method for Producing Metal-Resin Composite]

Next, will be explained a method for producing the metal-resin composite in the present embodiment (hereinafter, referred to as a "production method in the present embodiment"). The production method in the present embodiment is a method for producing the metal-resin composite 10 in which the metallic member 1 including a metal having a high melting point of 500° C. or more is integrated with the resin member 2. The production method comprises the steps of:

forming a thin film on the surface of the metallic member 1, the thin film including a metal with a low melting point less than 500° C. and having a thickness of 30 nm or more to 5 μm or less; forming an alloy layer 3 in which a metal of a high melting point and the metal of a low melting point are counter-diffused by heat-treating the metallic member 1 on which the thin film is formed, under the heating conditions of not melting the thin film in the non-oxidation atmosphere or in the reduction atmosphere; and forming a resin member 2 on the surface of the alloy layer 3. Hereinafter, the production method in the present embodiment will be explained referring to FIGS. 7A to 7E.

Figure 7A:
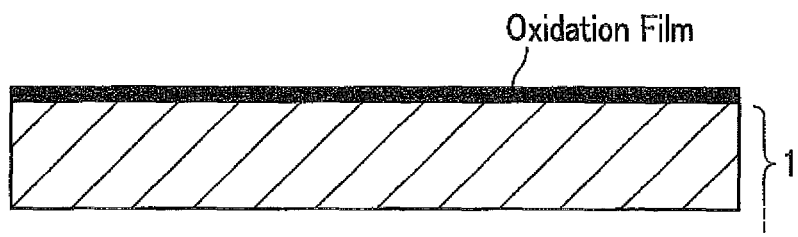
FIGS. 7A to 7E are schematic diagrams showing the steps of producing the metal-resin composite in the present embodiment.
Figure 7B:
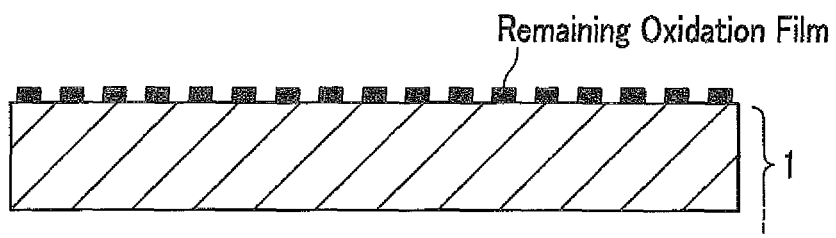

FIG. 7A to 7E are diagrams showing a production method of the metal-resin composite 10 in the present embodiment. As shown in FIG. 7A, for example, the metallic member 1 including a metal with a high melting point such as nickel, copper, aluminum and iron or the like is usually under the condition exposed in the air, resulting in the state that an oxidation film is formed on the surface of the metallic member 1. Accordingly, in the viewpoint of having the resin member adhere more securely, preferably the oxidation film thus formed is removed. When the oxidation film thus formed is removed, it is not always necessary to remove all of the oxidation film. Further, besides the oxidation film, preferably pollution such as oils and fats is removed. That is, before forming the thin film described hereinafter, it is preferable to conduct a step of cleaning the surface of the metallic member 1. The specific method of the cleaning step is not particularly limited. However, the cleaning step may be conducted by an etching process or the like. FIG. 7B shows a metallic member 1 after removing a part of the oxidation film (in FIG. 7B, about a half part) formed on the surface of the metallic member 1.

Figure 7C:
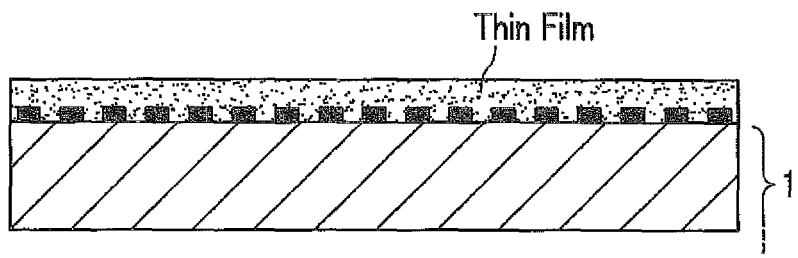
Figure 7D:
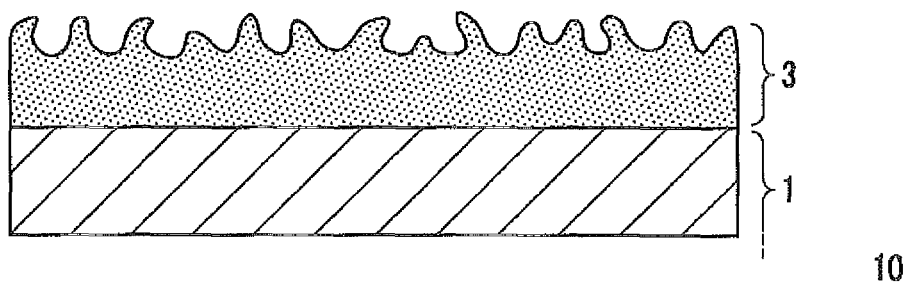
Figure 7E:
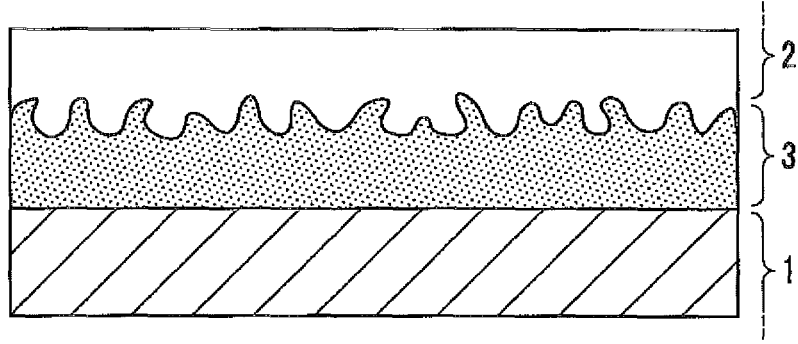

Next, a thin film that contains a metal with a low melting point such as zinc, tin, indium, and bismuth is formed on the surface of the metallic member 1, after removing a part of the oxidation film shown in FIG. 7B (that is, a thin film forming step). FIG. 7C shows a schematic cross-sectional view after forming the thin film. When the thin film is to be formed, the thin film forming step is conducted so that the thickness of the thin film becomes 30 nm or more to 5 μm or less. A specific method for forming the thin film is not particularly limited. However, at least any one of the methods including electroplating, physical vapor deposition, or chemical deposition is preferable. Further, specific conditions when the thin film is formed may be set optionally.

Figure 8A:
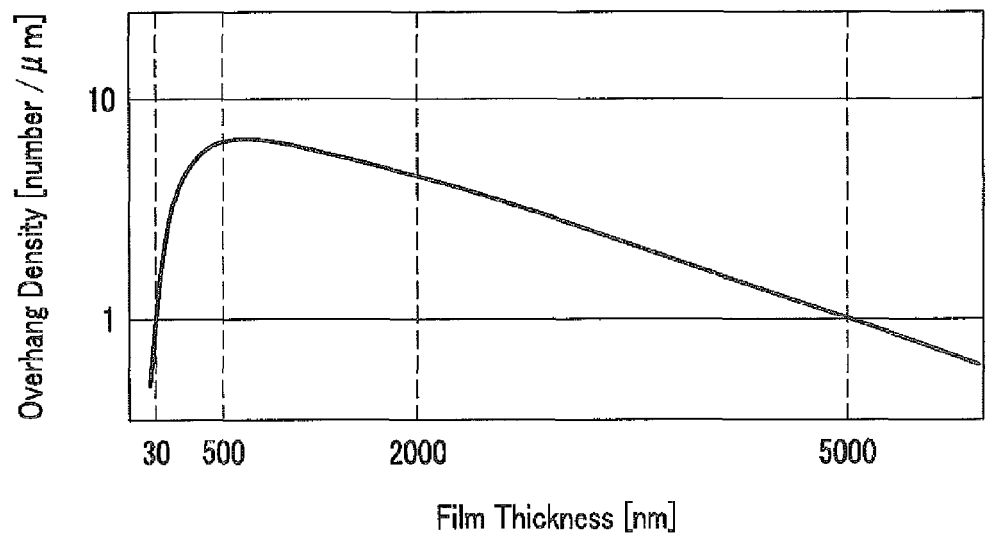
FIG. 8A is a graphic diagram showing a relationship between a film thickness and the overhang density in the metal-resin composite.
Figure 8B:
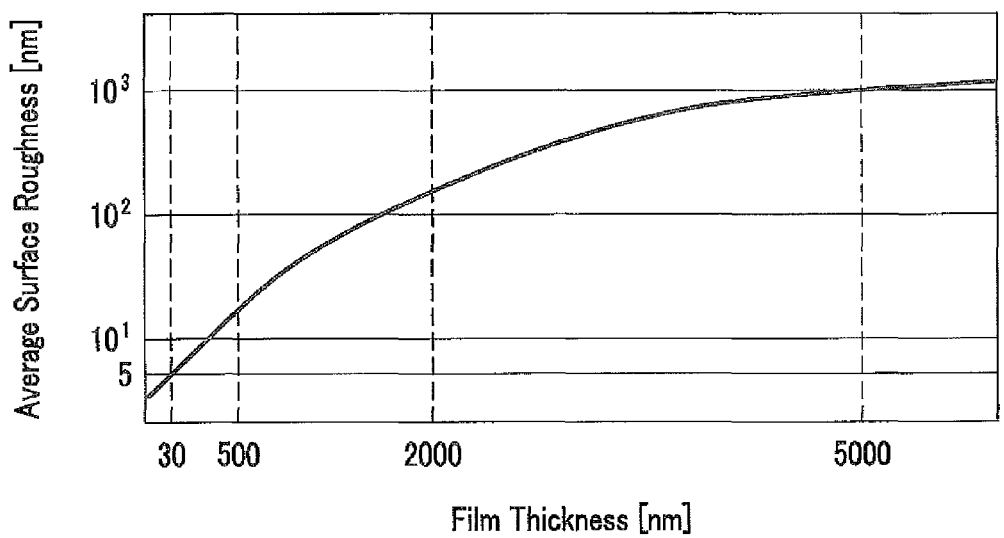
FIG. 8B is a graphic diagram showing a relationship between a film thickness and the average surface roughness in the metal-resin composite.

Then, the investigation of the present inventors afforded the graphic diagram shown in FIGS. 8A and 8B. FIGS. 8A and 8B respectively show a relationship between a film thickness and overhang density (in FIG. 8A), and a relationship between a film thickness and average surface roughness (in FIG. 8B), of the alloy layer 3 obtained after a resultant product, in which a thin film made of zinc was formed on the surface of the nickel plate, was heat-treated at 400° C. for 10 min. The respective curves represent approximate curves calculated by the least-squares method.

It was observed that if the film thickness of the alloy layer 3 was thinner than 30 nm, the average surface roughness became smaller than 5 nm, thereby lowering the adhesive strength, while if the film thickness of the alloy layer 3 was thicker than 5 μm, the overhang density became lower than 1 piece/μm, which decreased the anchor effect against the tensile force applied in the stretching direction, thereby also lowering the adhesive strength. Accordingly, the thickness of the thin film formed by the production method in the present embodiment was proved to be preferably in the range from 30 nm or more to 5 μm or less. Hereby, in the production method of the present embodiment, the film thickness formed on the alloy layer 3 was determined to be in the range from 30 nm or more to 5 μm or less, referring to the example using zinc as a metal of a low melting point, which was particularly used as a preferable metal with respect to the metal-resin composite 10.

Further, as mentioned in the section of [1-3. Alloy Layer 3], a preferable thickness of the alloy layer 3 is 0.1 μm or more to 20 μm or less. That basis is related to the film thickness thus formed. That is, in the production method of the present embodiment, when a thin film with the thickness of 30 nm is formed and subsequently an alloying process is conducted to form the unevenness with 5 nm or more, this procedure has the thickness of the alloy layer 3 the thinnest. That is, in such a case, about 0.1 μm is a preferably lowest value as the film thickness of the alloy layer 3. On the other hand, if the film thickness is 5 μm and the heat-treatment (or the alloying process) is conducted so that the unevenness having the average thickness is 5 nm or more to 1 μm or less is maintained, and further if a realistic heating time is considered, preferably the thickness of the alloy layer 3 is at most about 20 μm. Therefore, a preferable range of the thickness of the alloy layer 3 is determined to be 0.1 μm or more to 20 μm or less as mentioned above.

Note if the metal with a low melting point includes tin, indium or bismuth, a major factor of forming the unevenness through a diffusion process is a difference value between the diffusion speeds at the respective positions. Therefore, if the materials are changed, a thin film thickness in the thin film forming process and a thickness of an appropriate alloy layer formed in the alloying process are not so largely different, thereby to become the same level of the thicknesses as the case of zinc.

Next, the production method further comprises the steps of: heat-treating the metallic member 1, on which a thin film of the alloy layer 3 including a metal with a low melting point is formed, under the conditions without melting the thin film in the non-oxidation atmosphere or in the reduction atmosphere; and forming an alloy layer in which a metal with a high melting point and a metal with a low melting point mutually diffuse (that is, an alloy layer forming step). Herein, the terms "non-oxidation atmosphere or the reduction atmosphere" mean the atmosphere in which the metal included in the thin film and the metallic member 1 is not oxidized, for example, including a nitrogen gas atmosphere, an argon gas atmosphere, a hydrogen gas atmosphere, and a carbon monoxide atmosphere or the like.

Furthermore, the terms "heating conditions without melting the thin film" include, for example, heating conditions at the temperature equal to or less than the melting point of the metal with a low melting point, contained in the thin film. On the other hand, as mentioned above, the heating treatment makes the metal having a low melting point being alloyed with the metal having a high melting point included in the metallic member 1, whereby the melting point of the whole alloy layer 3 increases. Therefore, if the heating temperature increases at a slow speed, all of the metal having a low melting point is alloyed when the temperature reaches the melting point of the metal having a low melting point, resulting in failure of no more melting the metal having a low melting point. Accordingly, the terms "heating conditions without melting the thin film" mean generally the "heating at the temperature equal to or less than the melting point of the metal having a low melting point", while as long as the thin film does not melt, the resulting product may be heated at equal to or more than the temperature of the melting point of the metal having a low melting point. Hereby, such a heating treatment as mentioned above allows the alloy layer 3 to be formed, in which the metal having a high melting point included in the metallic member 1 and the metal having a low melting point included in the thin film mutually diffuse (see FIG. 7D).

The aforementioned hating conditions will be further explained in detail referring to the specific examples. For example, when zinc is used as the metal having a low melting point, the resulting product may be heated at the temperature of 400° C. or less. Further, when tin is used as the metal having a low melting point, after the resulting product is heated at 200 to 230° C. for the predetermined time, the product may be further heated at 250 to 350° C. as a two-stage heating treatment. Moreover, when indium is used as the metal having a low melting point, after the resulting product is heated at 130 to 150° C. for the predetermined time, the product may be further heated at 200 to 250° C. as a two-stage heating treatment. Furthermore, for example, when bismuth is used as the metal having a low melting point, the product may be heated at 260° C. or less, and where necessary, the product may be heated at 350° C. or less as a two-stage heating treatment.

Note the oxidation film or the like initially formed on the surface of the metallic member 1 may turn to be a part of the alloy layer 3 by the aforementioned heating treatment (that is, an oxidation product of the metal having a low melting point), or be discharged outside the system. However, a part of the oxidation film or the like may still remain. Accordingly, in order to make the resin member 2 more surely adhere to the alloy layer 3, preferably such an oxide or the like is completely removed before forming the resin member 2. Further, since the metal having a low melting point that did not turn to be an alloy may remain, preferably such a remaining metal having a low melting point is removed together. Namely, after conducting the aforementioned alloy layer forming step, preferably a metal having a lower melting point removing step is performed, in which the remaining metal having a low melting point and the oxide thereof are removed outside the system.

The above mentioned heating treatment allows the alloy layer 3 to be formed on the surface of the metallic member 1. Then, by forming the resin member 2 on the surface of the alloy layer 3 thus formed, the metal-resin composite 10 shown in FIG. 7E may be produced (that is, a resin forming step). The specific method of forming the resin member 2 is not particularly limited. However, when the resin member 2 is a thermosetting resin, preferably the method includes transfer molding or potting molding. Alternatively, when the resin member 2 is a thermoplastic resin, preferably the method is conducted by injection molding.

As mentioned hereinbefore, the production method in the present embodiment may have the resin member 2 tightly adhere without depending on the degree of the adhesiveness of the thin film, allowing the metal-resin composite 10 to be produced in a high yield rate regardless of whether the cleaning treatment step is conducted or not. Further, even though the metallic member 1 includes a plurality of metal element types, the production method in the present embodiment may be similarly applied, and moreover the resin member 2 having high adhesive strength may be formed, nevertheless using any types of the metallic member 1. In other words, various types of the metallic member 1 may become widely applied, to which the resin member 2 may adhere. Further, a high speed plating method at high current density may be applied to the formation of the thin film including the metal having a low melting point, enabling the number of supply times of a treatment solution when the thin film is formed, which results in the cost reduction of the treatment.

The investigation of the present inventors revealed that when the thin film was plated in the high speed at the high current density on the surface of the metallic member 1, the precipitation initiation of the thin film on the surface of the metallic member 1 did not uniformly begin on the whole surface in a size of a nano level, while the thin film was precipitated in the locally dispersed state. Moreover, the density rate between the metal member 1 and the metal of a low melting point had a significant difference based on the different initiation timing of the precipitation. Hereby, if the thin film was heated under the conditions without melting the thin film, the formation of the alloy layer 3 proceeded locally by mutual diffusion instead of uniformly, on the whole surface of the alloy layer 3. Accordingly, it was revealed that the unevenness in a size of a nano level was formed on the surface of the alloy layer 3 after conducting the alloying process.

Here, the metal having a high melting point included in the metallic member 1 formed the alloy layer 3 as diffusing through a diffusion inlet into the inside of the plated thin film, while the metal having a low melting point included in the thin film diffused through a diffusion inlet into the metallic member 1 thereby to enlarge the alloy layer 3 as piling up the resultant alloy at the diffused regions. At that time, a place distant from the diffusion inlet turned to be in a recessed shape. Further, if the diffusion speeds were different between the metal having a high melting point and the metal having a low melting point, Kirkendall voids were generated at the side of the metal element having a high diffusion speed, thereby to form an opening if the part of Kirkendall voids were exposed at the surface, resulting in the formation of the overhang shapes of which inside was recessed.

The unevenness having such shapes is characteristic in the film forming and the diffusion processes, in which no interface exists between the alloy layer 3 and the metallic member 1, and crystal particles and compositions have a continuous formation. Therefore, the alloy layer 3 located on the surface of the metallic member 1 is integrated with the metallic member 1, allowing no separation of the allow layer 3 to occur. Further, the alloy layer 3 and the resin member 2 are bonded together by the unevenness surface having microfine and overhang shapes on the surface and by the strong anchor effect, preventing the separation at the interface between the alloy layer 3 and the resin member 2.

As mentioned above, even though the types of the metals having a high melting point included in the metallic member 1 are different, each mutual diffusion phenomenon thereof is the same. Hereby, if the metal having a high melting point included in the metallic member 1 has a variation such as nickel, copper, aluminum and iron or the like, the production method capable of performing highly tight adhesion to the resin member 2 may be provided by the similar treatment process. Moreover, the thickness of the thin film thus formed is the degree of several tens to several hundreds nanometers, which allows the necessary unevenness to be formed. This enables the film forming time to be shorter and the consumption of the plating solution to be smaller, resulting in the advantage of the low costs for the surface treatments.

[3. Application of Metal-Resin Composite]

The metal-resin composite in the present embodiment may be used in the variously wide fields such as an electronic device field and an automotive part field or the like. Hereinafter, will be explained more specifically three embodiments referring to the attached drawings, as the applications of the metal-resin composite in the present embodiment. Note specific examples of the metal-resin composite described below are only exemplary products, which may be modified without apart from the scope of the present invention.

[3-1. Busbar]

Figure 9:
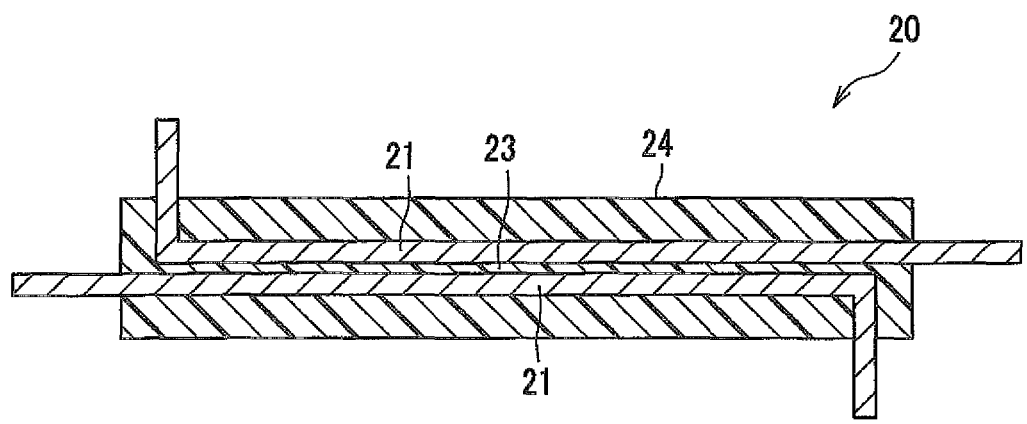
FIG. 9 is a schematic diagram showing a structure of a busbar in the present embodiment.

As shown in FIG. 9, a busbar in the present embodiment comprises a construction in which at least two metallic lead conductors 21 are sealed by an insulating resin 24. Further, between the two metallic lead conductors 21 and the resin 24, is formed an alloy layer (not shown in FIG. 9) comprising one or more types of metals selected from the group of zinc, tin, indium and bismuth, and the metal included in the metallic lead conductor. Further, at the interface between the alloy layer and the resin 24, the average surface roughness of the alloy layer is in the range from 5 nm or more to less than 1 μm, and at least a part of the shapes of the unevenness formed on the interface of the alloy layer have overhang shapes, and one or more overhang shapes are formed per 1 μm in the parallel direction of the interface. Herein, since the explanation of the alloy layer is the same as that of the alloy layer already explained in the aforementioned metal-resin composite 10, the explanation will be omitted, and instead, the whole construction of the busbar 20 will be only explained in the descriptions below.

The metallic lead conductors 21 arranged in the busbar 20 execute input and output of electric signals, and the same material as the aforementioned metallic member 1 may be used for the conductors 21. Further, the metallic lead conductors 21 may be materials plated in advance. Moreover, the resin 24 arranged in the busbar 20 may be made of a thermosetting resin such as an epoxy resin. Particularly, at the alloy layers formed on the surfaces of the metallic lead conductors 21, the average surface roughness of 50 nm or less allows the especially high adhesive strength to be secured, even though a thermoplastic resin such as a polyphenylene sulfide (PPS) is used for the resin 24.

If the metallic lead conductors are arranged closely like the busbar (for example, the busbar 20 shown in FIG. 9 has a gap 23 of 0.3 mm between the metallic lead conductors 21 in order to decrease the inductance component), in the case that the metallic lead conductor peels from the sealed resin, partial discharge may occur in the peeling space by the effect of the high electric field generated by the applied voltage between the metallic lead conductors. Hereby, the long-term repeated discharge carbonizes the resin in a progressive manner, which may cause an insulation break of the busbar. Accordingly, in order to produce a busbar securing the reliability of withstand voltage, it is extremely important to improve the adhesiveness between the metallic lead conductor and the resin, thereby to suppress the metallic lead conductor to peel form the resin. The busbar 20 in the present embodiment is excellent in the adhesive strength between the metallic lead conductor and the resin, which prevents the above mentioned drawbacks, allowing the busbar to have the high reliability of withstand voltage.

A production method for manufacturing such a busbar is not particularly limited. However, the following method may be used for the manufacturing of the busbar. As the metallic lead conductors 21, copper plated with nickel may be used. Then, the plated nickel is electroplated with zinc having a thickness of 500 nm, and the resulting product is heat-treated at 350° C. for 5 min in the hydrogen gas atmosphere (or reduction atmosphere), whereby a nickel-zinc alloy layer with a thickness of 700 nm may be formed. Further, the average surface roughness of the alloy layer is about 20 nm, and the unevenness with the overhang density of 6 pieces or more/μm on the surface of the alloy layer may be formed.

Moreover, aluminum or the like plated with zinc may be used as the metallic lead conductors 21. The use of such a material allows the unevenness of which average surface roughness is 5 to several hundreds nanometers may be formed on the surface thereof.

[3-2. Module Case]

Figure 10:
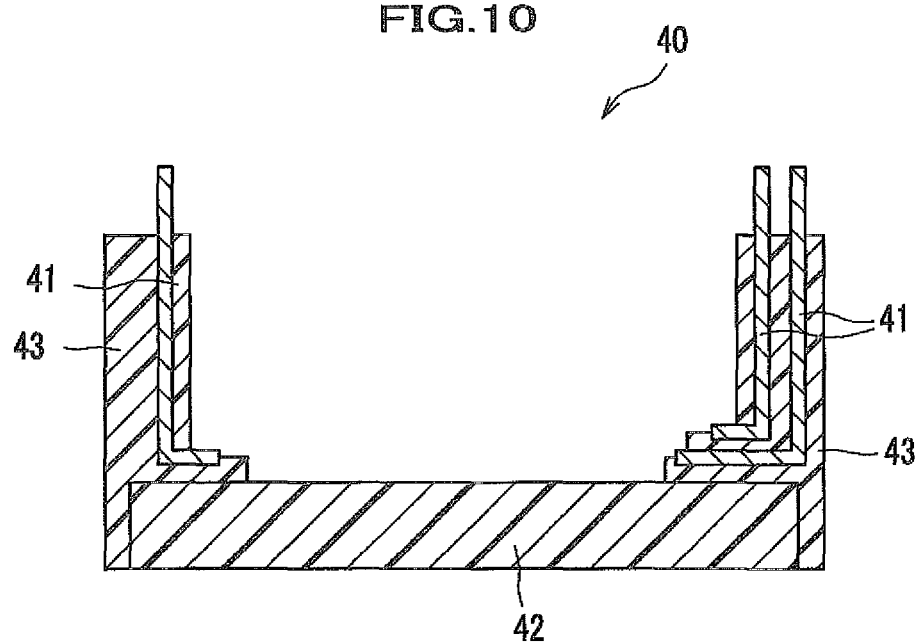
FIG. 10 is a schematic diagram showing a structure of a module case in the present embodiment.

In a module case 40 in the present embodiment, a side wall of a resin 43 is formed on a base substrate 42 (or a heat sink) including a metal and the metallic lead conductors 41 are sealed in the side wall as shown in FIG. 10. Further, between the base substrate 42 as a heat sink and the resin 43, and/or, between a metallic lead conductor 41 and the resin 43, is formed an alloy layer (not shown in FIG. 10) comprising one or more types of metals selected from the group of zinc, tin, bismuth and indium, and the metal included in the metallic lead conductor 41. Further, at the interface between the alloy layer and the resin 43, the average surface roughness of the alloy layer is 5 nm or more to less than 1 μm, at least a part of the shapes of the unevenness formed on the interface of the alloy layer have overhang shapes, and one or more overhang shapes are formed per 1 μm on the interface in the parallel direction thereof. Herein, since the explanation of the alloy layer is the same as that of the alloy layer already explained in the aforementioned metal-resin composite 10, the explanation will be omitted, and instead, the whole construction of the module case 40 will be only explained in the descriptions below.

For the module case 40, copper plated with nickel or the like may be used as the metallic lead conductor 41. Further, as a material of the base substrate 42 at the interface between the resin 43 and the base substrate 42, for example, copper plated with nickel may be used. With respect to the resin 43, in the viewpoint of good productivity, for example, polyethylene phenylene sulfide (PPS), and polyethyleneterephtalate (PBT) or the like may be used. Further, between the metallic lead conductor 41 and the resin 43, and between the base substrate 42 and the resin 43, the aforementioned alloy layer may be arranged.

Figure 11:
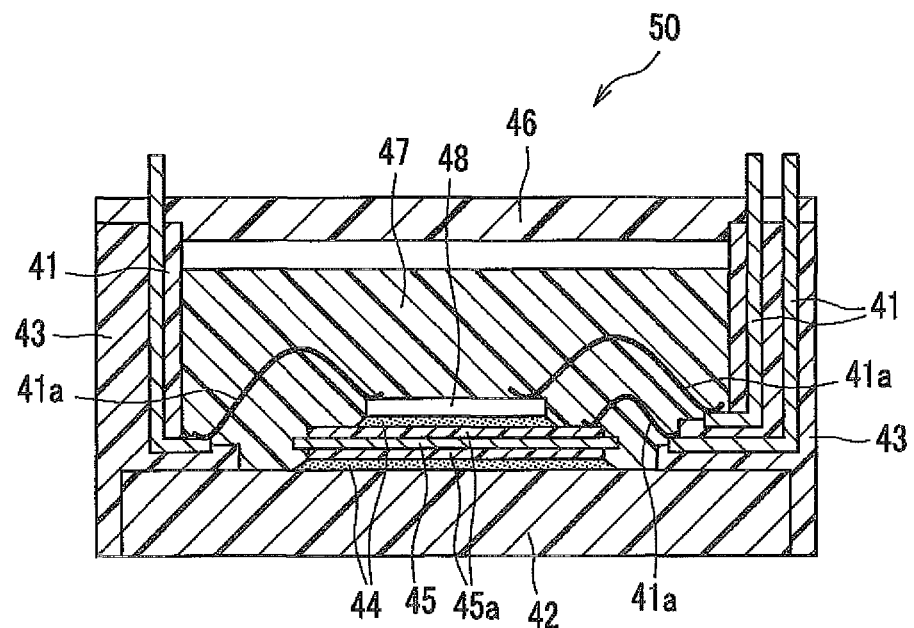
FIG. 11 is a schematic diagram showing a structure of an IGBT module in the present embodiment.

FIG. 11 is a diagram showing a cross-sectional structure of the IGBT module 50 using the module case 40 in FIG. 10. Since the members shown as the same reference numbers as in FIG. 10 represent the same members in FIG. 10, the explanations thereof will be omitted. The IGBT module 50 is equipped with a ceramic wiring substrate 45 on which surface a metallic pattern 45a is formed via a solder 44 on the base substrate 42. Further, on the ceramic wiring substrate 45, an IGBT chip 48 is further equipped via the solder 44.

The electrode on the IGBT chip 48 is electrically connected with the respective metallic lead conductors 41 via aluminum wires 41a. Further, the joint between the electrode on the IGBT chip 48 and the respective metallic lead conductors 41 may be performed by ultrasonic joining. Moreover, a silicone gel 47 is filled inside the module case 40 so as to seal those above mentioned members, thereby to form an upper space, so that a cover 46 made of a resin hermetically seals the module.

As mentioned above, the production of the IGBT module using the module case in the present embodiment may prevent the peeling between the resin 43 and the metallic lead conductors 41, and between the resin 43 and the base substrate 42 at each interface, under the thermal stress and humidity environment when using the module. Further, the production of the IGBT module allows the airtight property inside the module to be maintained in a long-term, and the penetration of moisture to be prevented. Accordingly, this may provide the IGBT module capable of stably operating the electronic circuit in the long-term, and having the high reliability.

[3.3 Resinous Connector Part]

Figure 12:
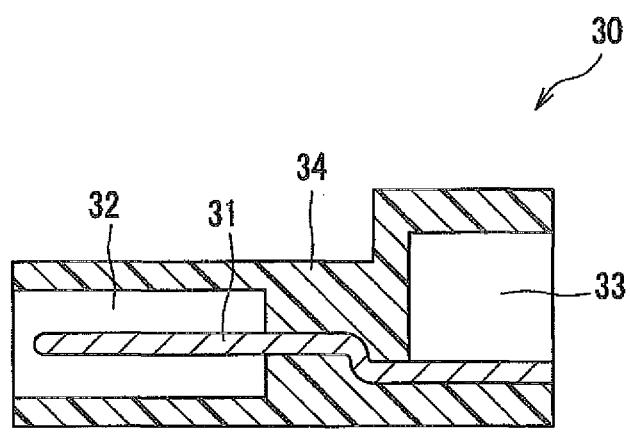
FIG. 12 is a schematic diagram showing a structure of a resinous connector part in the present embodiment.

The resinous connector part 30 in the present embodiment 30, as shown in FIG. 12, seals the lead conductor 31 in the resin 34. Further, the alloy layer (not shown in FIG. 12) is formed, comprising one or more types of metals selected from the group of zinc, tin, bismuth and indium between the metallic lead conductor 31 and the resin 34, and the metal included in the metallic lead conductor 31. Moreover, at the interface between the alloy layer and the resin, the average surface roughness of the alloy layer is 5 nm or more to less than 1 μm, at least a part of the shapes of the unevenness formed on the interface of the alloy layer have overhang shapes, and one or more overhang shapes are formed per 1 μm on the interface in the parallel direction thereof. Herein, since the explanation of the alloy layer is the same as that of the alloy layer already explained in the aforementioned metal-resin composite 10, the explanation thereof will be omitted, and instead, the whole construction of the resinous connector part 30 will be only explained in the descriptions below.

The metallic lead conductor 31 may be constructed by the same material, for example, as the material of the aforementioned metallic lead conductor 21 and metallic lead conductor 41. Further, the resin 34 may be constructed by the same material as the resin 24 and the resin 43.

The resinous connector part 30 is equipped with the metallic lead connector 31 in the resin 34, in order to electrically connect an outside air space 32 and a module inside space 33. Such an arrangement of the metallic lead connector 31 in the resin 34 may prevent moisture or the like from penetrating into the module inside space 33 that is connected with an electric device or the like, allowing the electric device to be securely connected without problem. Accordingly the resinous connector part 30 having such a construction may prevent the metallic lead connector 31 form peeling off the resin 24 even though an external force is exerted on the above mentioned components under the high humidity and the high temperature environment, allowing the resinous connector part 30 excellent in the airtight reliability to be provided.

EXAMPLE

Hereinafter, will be explained the present embodiments in detail showing some examples. However, the present embodiments are not limited to the specific examples described below, and any various modifications may be performed without apart from the scope and spirit of the present invention.

Example 1

Here, nickel was selected as a metal with a high melting point included in a metallic member 1, zinc was selected as a metal with a low melting point included in an alloy layer 3, and an epoxy resin was selected as a resin member 2, whereby a metal-resin composite 10 was produced.

First, a surface of a nickel member was electroplated with zinc having a thickness of 500 nm using a current density of 3 A/dm$^2$, to form a thin film made of zinc on the surface of the nickel member. Then, the nickel member on which surface the thin film made of zinc was formed, was heat-treated at 400° C. for 5 min in the reduction atmosphere including a hydrogen gas, thereby to form an alloy layer 3 including a zinc-nickel alloy.

After the treatment, an epoxy resin of a thermosetting resin was transfer-molded under the conditions of: transfer pressure of 2.5 MPa; temperature of the metal mold at 175° C.; molding time of 90 sec. Further, the epoxy resin was heat-treated at 175° C. for 6 hr, whereby a metal-resin composite 10 of the present embodiment was produced.

Figure 13A:
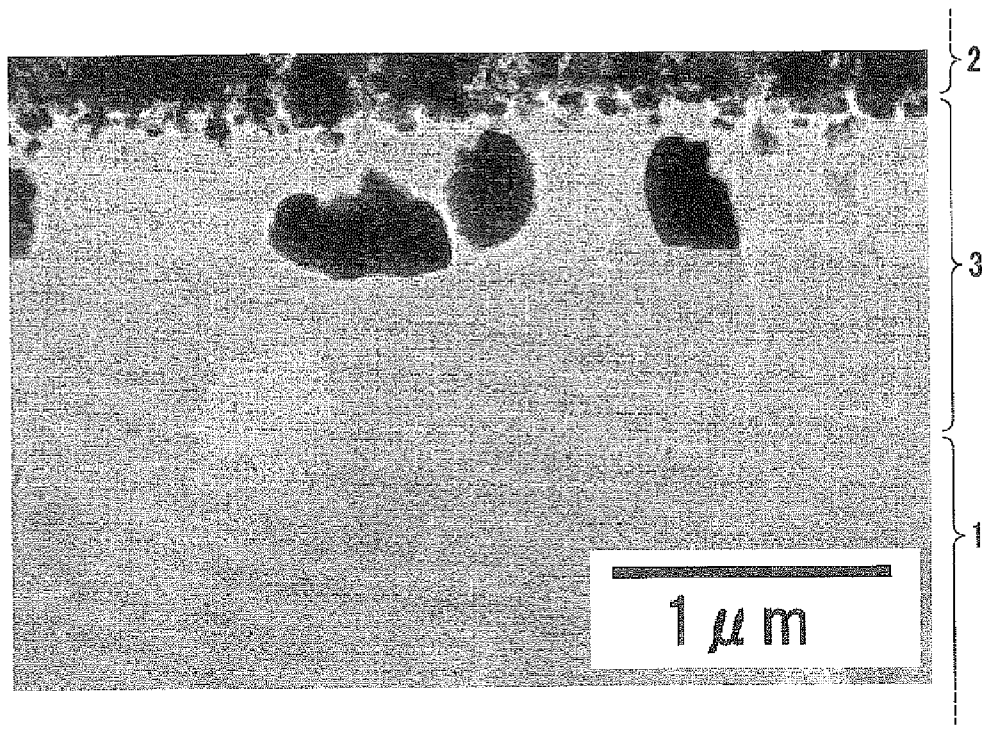
FIGS. 13A and 13B are photograph substitutes for diagrams.
Figure 13B:
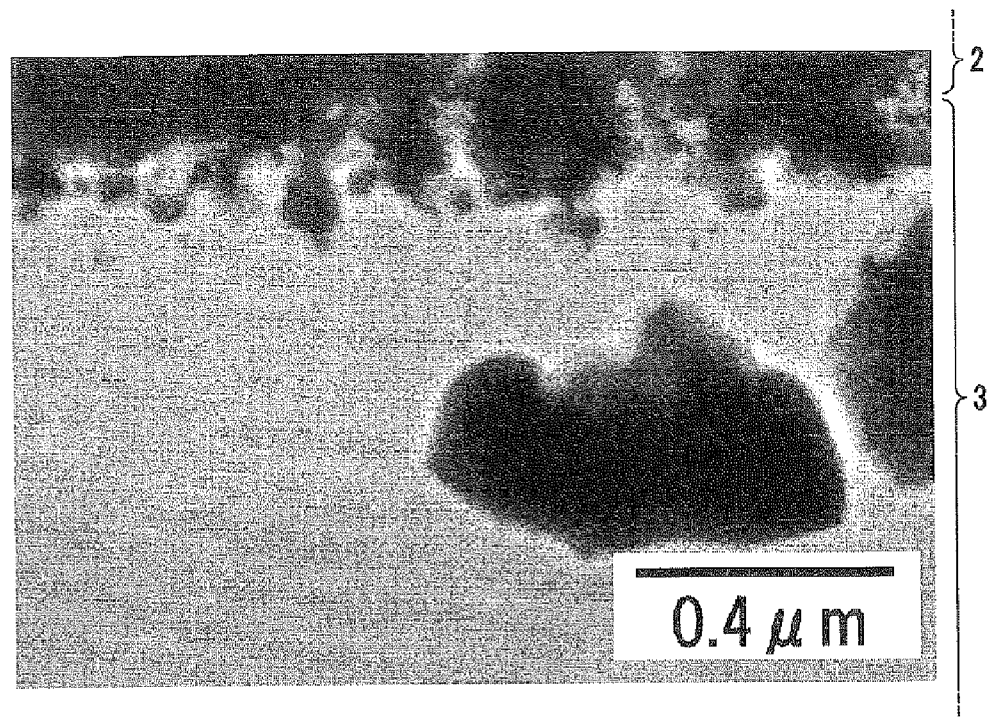

FIG. 13A shows a photograph of a cross-section of the metal-resin composite thus obtained, taken by a Scanning Electron Microscope (SEM). FIG. 13B shows a magnified photograph of the cross-section in the vicinity of the interface between the resin member and the alloy layer shown in FIG. 13A, taken by a Scanning Electric Microscope (SEM).

As shown in FIG. 13A, the alloy layer 3 was formed on the surface of the metallic member 1, and the resin member 2 was formed on the alloy layer 3. Further, as shown in FIG. 13B, unevenness with a scale of several tens to several hundreds nanometers was formed on the surface of the alloy layer 3, at the interface between the alloy layer 3 and the resin member 2. Herein, a part of the unevenness has overhang shapes, and such overhang shapes are observed so that one or more overhang shapes are formed per 1 μm in the parallel direction of the interface between the resin member 2 and the alloy layer 3.

Further, the epoxy resin composing of the resin member 2 penetrates recesses each having a size of several tens nanometers included in the unevenness, thereby to adhere together without any defects. Moreover, void defects each having a sub μm size are formed inside the alloy layer 3, and the void defects each having a several nanometers size are also formed in the vicinity of the resin member 2 side, that is, in the vicinity of the surface thereof.

Figure 14:
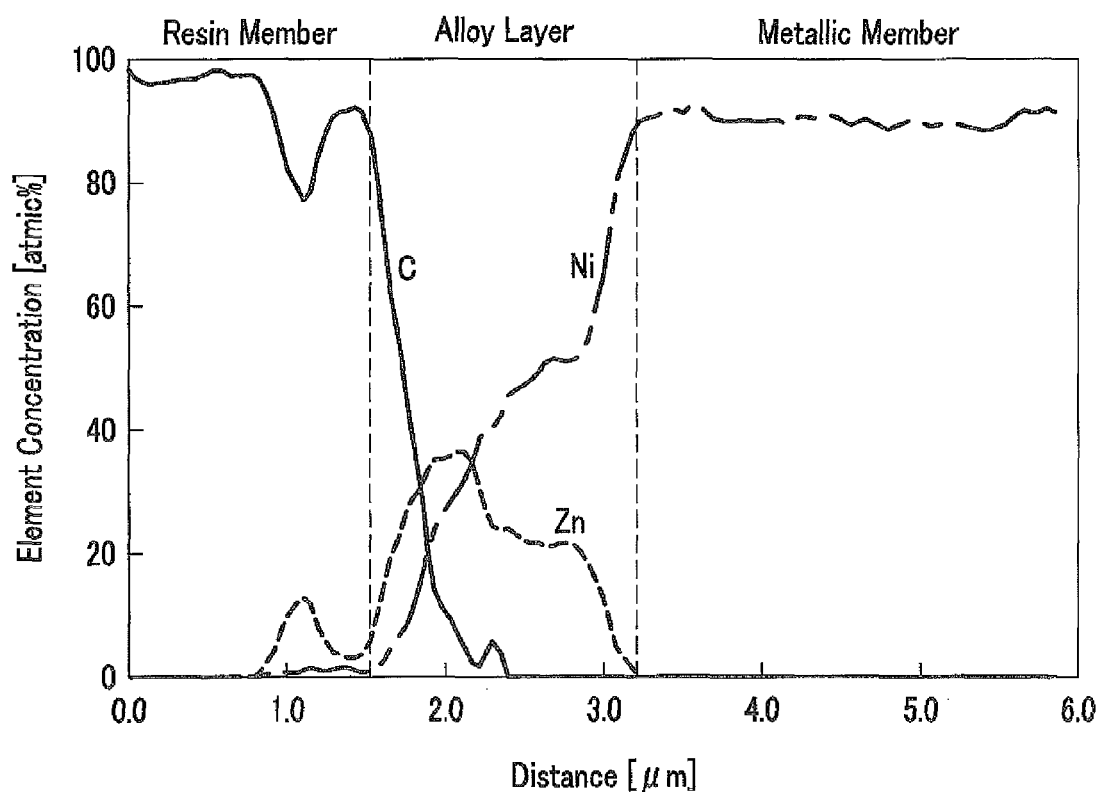
FIG. 14 is a graphic diagram showing a distribution of the element concentration in the vertical direction of the photograph shown in FIG. 13A.

FIG. 14 is a graphic diagram showing element concentration distribution in the thickness direction of the photograph shown in FIG. 13A. In the graph shown in FIG. 14, the horizontal axis represents a distance from the surface of the resin member 2 to the metallic member 1 in the vertical direction, and the vertical axis represents element concentration in the above mentioned direction of the composite. Note the two dotted lines in the vertical direction shown in the graph represent the interfaces between the resin member 2 and the alloy layer 3, and the alloy layer 3 and the metallic member 1. As shown in FIG. 14, it is observed that the amount of zinc (or metal having a low melting point) in the alloy 3 is larger at the side of the resin member 2 of the alloy layer 3 than that at the side of the metallic member 1. Further, it is also observed that the distribution of the zinc element concentration contentiously changes in the alloy layer 3. In other words, the alloy layer 3 is comprised of substantially two layers including a zinc rich layer at the side of the resin member 2 and a nickel rich layer at the side of the metallic member 1. However, the interface between the two layers was unable to be clearly observed as shown in FIG. 13A.

Example 2

Figure 15A:
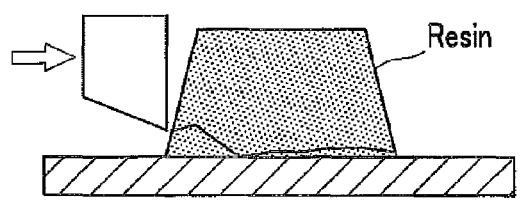
FIG. 15A is a diagram explaining a method of the shearing strength test.
Figure 15B:
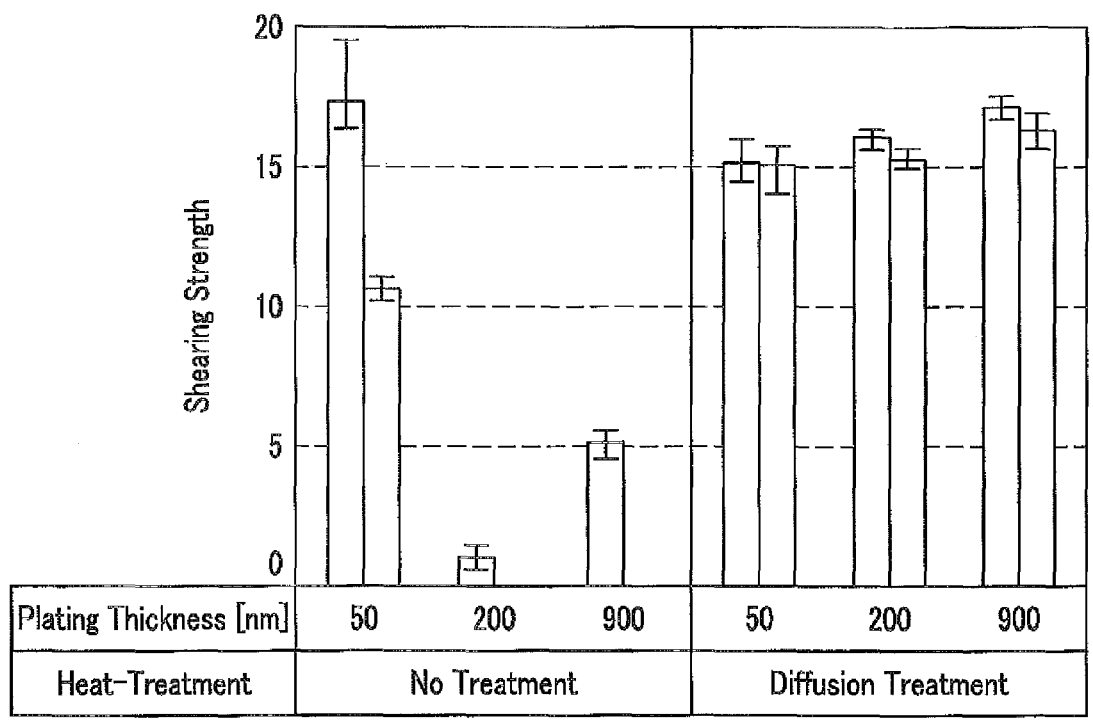
FIG. 15B a graphic diagram showing results of the shearing strength test on the adhesiveness between the metallic member and the resin member in Example 2.

A copper plate (or a metallic member) plated with nickel having a thickness of 0.5 mm was further plated with zinc, to form three types of the plates having the thicknesses of 50 nm, 200 nm, and 900 nm. After the plating, the epoxy resin (Cognis Co.; RM370) was heat-treated in the same manner as in Example 1 to form a resin member, thereby producing a metal-resin composite. Then, a shearing test was conducted for the metal-resin composite thus obtained. FIG. 15A shows a method of the shearing test and FIG. 15B shows the results obtained from the test. In the shearing test, the resin member 2 thus formed was pressed from the side thereof and the pressure (or shearing strength) when the resin member 2 peeled is shown in FIG. 15B.

Note FIG. 15B shows a case in which the epoxy resin adhered to the alloy layer without conducting the aforementioned heat-treatment (that is, no heat-treatment case) as a comparative reference.

The graph shown in FIG. 15B indicates that bars with the representative plating thicknesses at the left side area show the strengths against the shearing treatment (or shearing strengths before a degradation treatment) of the metal-resin composites, while bars at the right side area show the shearing strengths of the metal-resin composites thus produced which were subjected to the moisture absorption treatment under the conditions of 86° C./85% (or relative humidity) for 168 hr, and then further subjected to the reflow treatment repeatedly operated three times under the conditions of being heated at 260° C. for 60 sec, thereby to degrade the metal-resin composites.

As shown in FIG. 15B, the shearing strength of 15 MPa or more was obtained only in the case of the composite having a plating thickness of 50 nm and conducted no degradation treatment, while the low shearing strengths of about 10 MPa or less were obtained in the other cases conducted no heat-treatment. Moreover, in the metal-resin composites conducted no heat-treatment with a plating thickness of 200 nm or 900 nm, the epoxy resins of the metal-resin composites peeled away after the degradation treatment, resulting in impossibility in further analyzing. Alternatively, when the metal-resin composites were heat-treated, every metal-resin composite having the plating layer with any thickness showed good shearing strength of about 15 MPa, even after the degradation treatment. Note the epoxy resin caused the breaking inside the resin at about 14 to 15 MPa. Accordingly, when the metal-resin composite was heat-treated, the shearing strength of the metal-resin composite showed the similar strength of about 15 MPa as causing the breaking inside the resin.

Figure 16A:
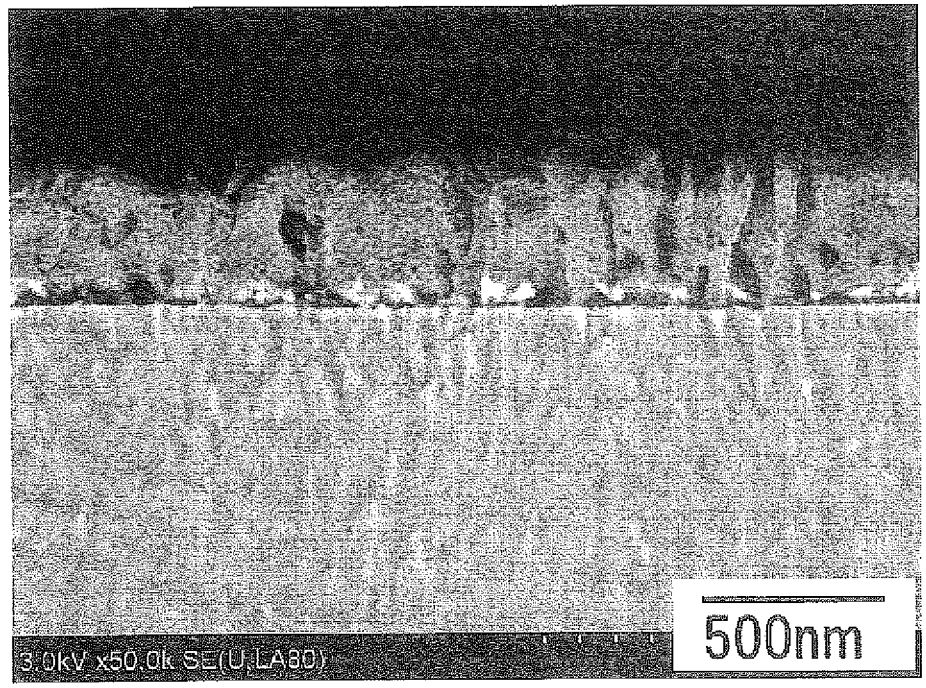
FIGS. 16A and 16B are photographs substitute for diagrams.
Figure 16B:
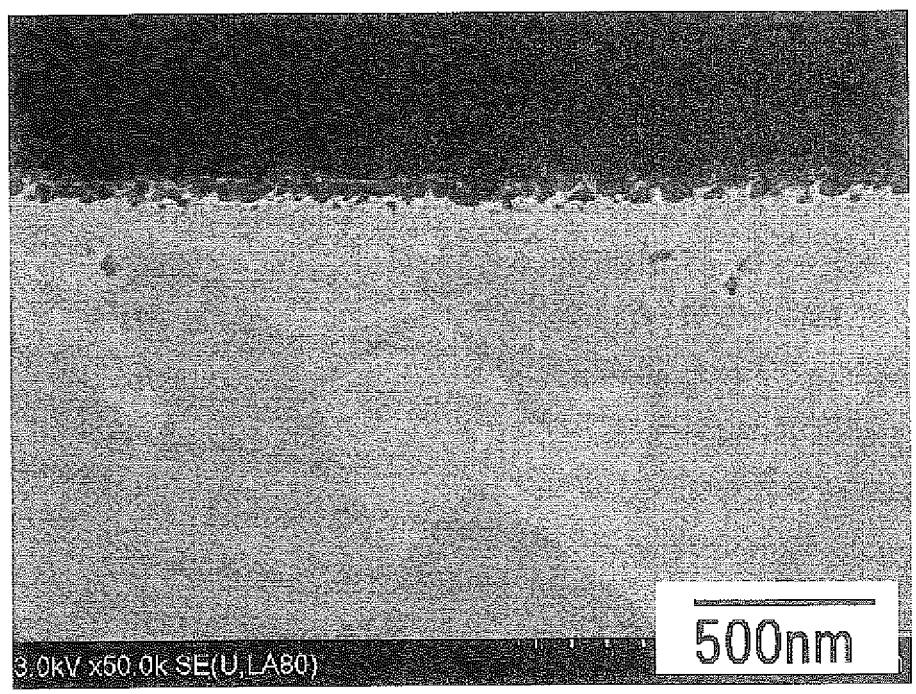

FIGS. 16A and 16B are photographs each taken by a scanning electron microscope in the vicinity of the surface of the metallic member 1 having the thin film with the thickness of 200 nm. FIG. 16A shows a metal-resin composite conducted with no heat-treatment, while FIG. 16B shows a metal-resin composite conducted with the heat-treatment at 400° C. for 5 min. As shown in FIG. 16A, many defects were observed between the thin film and the metallic member 1. As a result, it may be estimated that this leads to low interfacial strength. In contrast, when a metal-resin composite was heat-treated, as shown in FIG. 16B, the defects disappeared and fine unevenness in the nanometer size was formed on the surface of the metallic member 1. Accordingly, it is construed that the alloy layer 3 and the metallic member 1 became tightly connected each other, allowing the interfacial strength to be improved.

As mentioned hereinbefore, the metal-resin composite 10 of the present embodiment using nickel as a metal with the high melting point comprises a firm alloy layer 3, which includes zinc having a strong chemical interaction, is formed on the surface of the nickel plate having a little chemical interaction with the resin member 2. Further, the unevenness comprising overhang structures in the size of several to several hundreds nanometers on the surface of the alloy layer 3 was formed, thereby to produce a structure integrated with the resin. Accordingly, this allows the shearing strength in the shear and tensile directions to be greatly increased, and a metal-resin composite 10 to be obtained even after conducting the degradation treatment under the high humidity and high temperature circumstantial conditions.

Example 3

A metal-resin composite 10 was produced by selecting copper as a metal with a high melting point included in a metallic member 1, zinc as a metal with a low melting point included in an alloy layer 3, an epoxy resin as a resin member 2.

First, a surface of the copper plate was electroplated with zinc having a thickness of 900 nm using the current density of 3 A/dm$^2$, thereby to form a thin film made of zinc on the surface of the copper plate. Then, the copper plate, on which the thin film made of zinc was formed, was heat-treated at 350° C. for 5 min in the reduction atmosphere including a hydrogen gas, whereby an alloy layer 3 containing a zinc-copper alloy was formed.

After the treatment, a thermosetting epoxy resin was transfer-molded under the conditions of: transfer pressure of 2.5 MPa; molding temperature of 175° C.; and molding time of 90 sec. Further, the resulting product was heat-treated at 175"C for 6 hr, thereby to produce a metal-resin composite 10 of the present embodiment.

Figure 17:
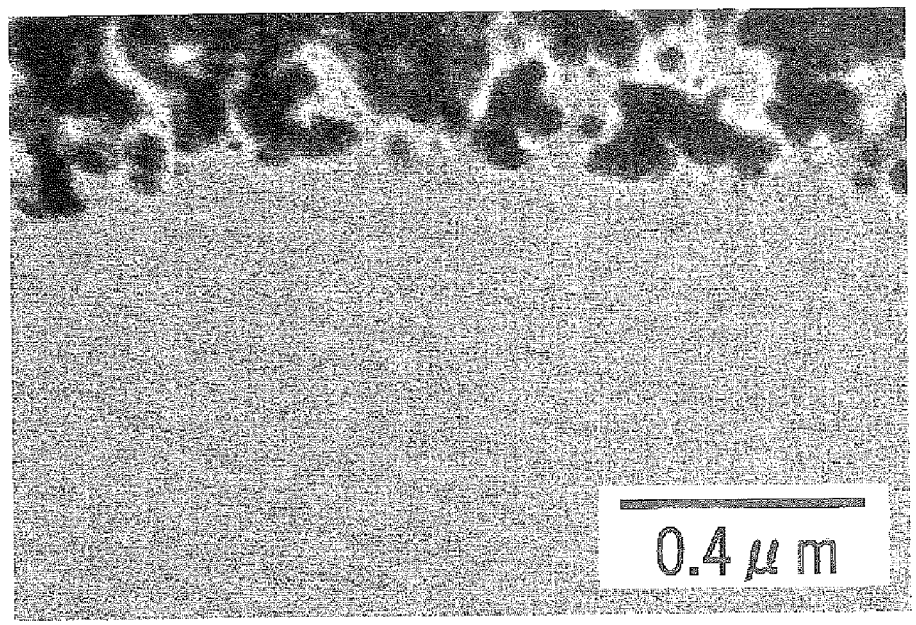
FIG. 17 is a photograph substitute for diagram of the cross-section of the metal-resin composite in Example 3, taken by a scanning electron microscope.

FIG. 17 shows a photograph of the metal-resin composite in the vicinity of the cross-section between the alloy layer 3 and the resin member 2, taken by a scanning electron microscope.

As shown in FIG. 17, a copper-zinc alloy layer was formed, and the unevenness in the size of several hundreds nanometers was formed in the alloy layer 3 near the side of the resin member 2, comprising overhang shapes at protrusions. Accordingly, this allows the epoxy resin to be filled into recesses of the alloy layer 3, with the size of several tens to hundreds nanometers, thereby to adhere each other having no defects.

Figure 18:
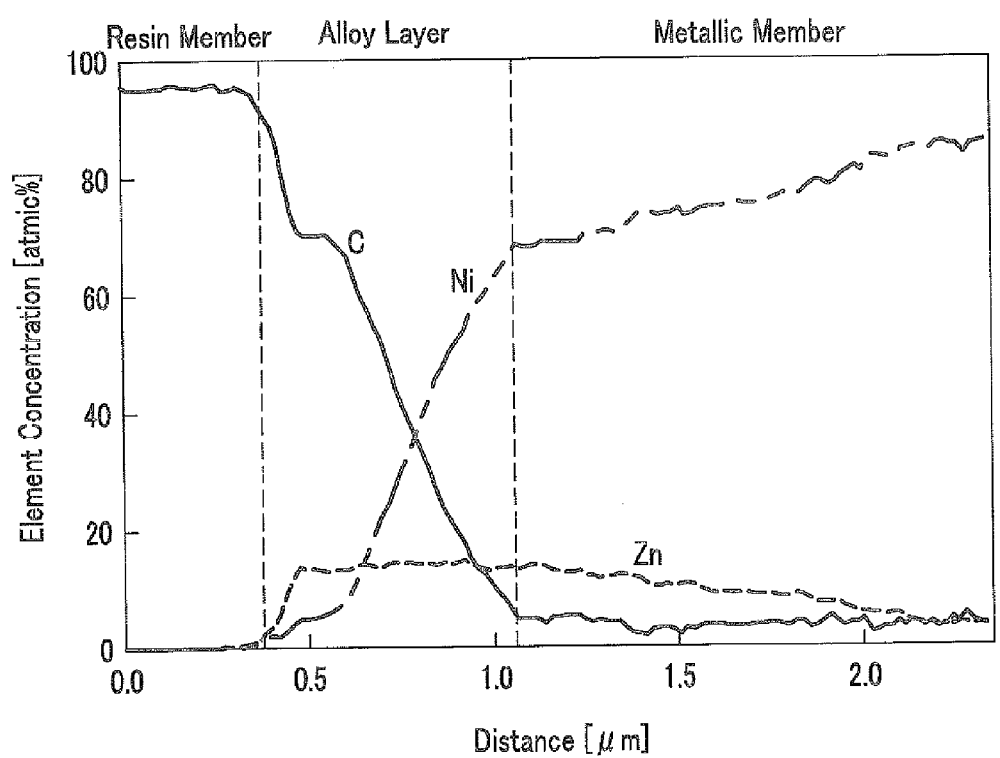
FIG. 18 is a graphic diagram showing the distribution of the element concentration in the vertical direction of the photograph shown in FIG. 17.

FIG. 18 is a graphic diagram showing the element concentration distribution in the thickness direction with respect to the photograph shown in FIG. 17. In the graph shown in FIG. 18, the horizontal axis represents a distance from the surface of the resin member 2 to the metallic member in the vertical direction, and the vertical axis represents element concentration in the above mentioned direction of the composite. Note the two dotted lines in the vertical direction shown in the graph represent the interfaces between the resin member 2 and the alloy layer 3, and between the alloy layer 3 and the metallic member 1. As shown in FIG. 18, it is observed that the epoxy resin penetrates into the alloy layer 3 to the depth of about 600 nm from the surface of the resin member 2 associated with the photograph shown in FIG. 17. Further, the concentration rate between zinc and copper shows that the zinc concentration near the side of the epoxy resin is high, then the concentration rate between copper and zinc sharply changes at the region apart from the surface of the resin member 2 in the distances of 200 to 600 nm, and the zinc concentration gradually reduces from about ten several % near the metallic member side 1 at the region which is deeper than 600 nm.

As mentioned hereinbefore, the metal-resin composite 10 of the present embodiment using copperas a metal with a high melting point has a structure in which the resin is integrated with the alloy layer 3, on which surface the unevenness having overhang shapes in the size of several hundreds nanometers is formed. Accordingly, this allows the shearing strength of the metal-resin composite in the sharing and tensile directions to be greatly improved, resulting in the production of a metal-resin composite 10, even after conducting the degradation treatment under the high humidity and high temperature environmental conditions.

Herein, if the metal-resin composite 10 of the present embodiment using aluminum as a metal with a high melting point is produced and the sharing test shown as mentioned above (in Example 2), the shearing strength of the composite 10 is 14 MPa or more. Further, the metal-resin composite 10 maintains 90% or more of the sharing strength that is a value before degradation treatment, even after conducting the degradation treatment for the resulting composite. Therefore, that result shows that a metal-resin composite 10 having a high adhesive property may be obtained, even if aluminum is used as a metal with a high melting point.

Example 4

Figure 19:
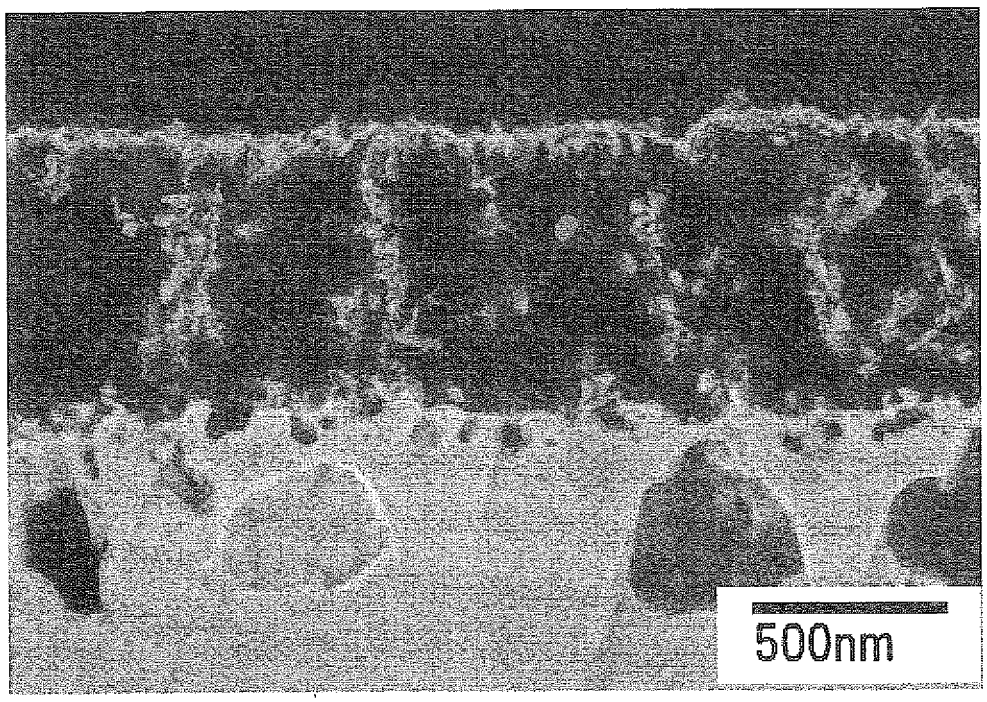
FIG. 19 shows a photograph substitute for diagram of the cross-section of the metal-resin composite in Example 4, taken by a scanning electron microscope.

FIG. 19 shows a photograph substitute for a diagram of the interface between the metallic member and the alloy layer after forming the zinc plated layer with a thickness of 900 nm on the nickel plate, and heat-treating the resulting product at 400° C. for 10 min, taken by a transmission electron microscope. In FIG. 19, it is observed that thin film-like zinc oxide remains at the upper portion of the nickel-zinc alloy layer where the microfine unevenness is formed. When a nickel metal is plated with zinc to form a relatively thick zinc layer, the oxidation film shown in FIG. 19 still remains. This may prevent the tight adhesion between the resin member 2 and the alloy layer 3 or exert a bad influence on the characteristics of the electronic circuit because of the migration of the remaining substance. Hereby, it is construed as particularly preferable to add a step of washing/cleaning the surface of the plated metallic member 1 with an acidic or an alkaline solution after the metal member 1 is plated to form the alloy layer, in the production steps shown in FIGS. 7A to 7E. Here, zinc oxide is dissolved in an alkaline solution, while a nickel-zinc alloy is not dissolved in an alkaline solution. Thus, this allows only the thin film made of zinc oxide to be easily removed.

As mentioned above, according to the production method of the present embodiment, the washing/cleaning step allows the adhesion between the resin member and the metallic member to be secured, thereby to provide a metal-resin composite in a high production yield.

What is claimed is:

1. A metal-resin composite comprising:
   a metallic member including a metal with a high melting point of 500° C. or more;
   a resin member integrated with the metallic member; and
   an alloy layer containing a metal with a low melting point less than 500° C. between the metallic member and the resin member, wherein,
   average surface roughness of the alloy layer is in the range from 5 nm or more to less than 1 μm at an interface between the alloy layer and the resin member,
   a period of unevenness formed on the interface of the alloy layer is in the range from 5 nm or more to less than 1 μm, at least a part of the shapes of the unevenness comprise overhang shapes formed by heating at temperatures just below the melting point of the metal having a low melting point,
   an amount of the metal with a low melting point included at an interface side of the resin member is larger than an amount of the metal with a low melting point included at an interface side of the metallic member, when the alloy layer is halved in a parallel direction of the interface,
   a concentration of the metal with a low melting point in the alloy layer gradually decreases from the interface side of the resin member to the interface side of the metallic member, and
   wherein the metal with the high melting point is nickel and the metal with the low melting point is zinc.

2. The metal-resin composite as described in claim 1, wherein
   one or more of the overhang shapes are formed per 1 μm in the parallel direction of the interface.

3. The metal-resin composite as described in claim 1, wherein the alloy layer further comprises carbon, and a concentration of the carbon within the alloy layer gradually decreases from the interface side of the resin member toward the interface side of the metallic member.

4. A metal-resin composite comprising:
   a metallic member including a first metal with a melting point of 500° C. or more;
   a resin member integrated with the metallic member; and
   an alloy layer including a second metal with a melting point of less than 500° C., the alloy layer being between the metallic member and the resin member,
   wherein an average surface roughness of the alloy layer is from 5 nm or more to less than 1 μm at an interface between the alloy layer and the resin member,
   a period of unevenness of the surface of the alloy layer at the interface is from 5 nm or more to less than 1 μm, at least a part of the shapes of the unevenness comprise overhang shapes formed by heating at temperatures just below the melting point of the metal having a low melting point,
   an amount of the second metal in a first side of alloy layer adjacent to the resin member is larger than an amount of the second metal in a second side of the alloy layer adjacent to the metallic member,
   a concentration of the second metal gradually decreases from the first side of the alloy layer to the second side of the alloy layer, and
   wherein the metal with a high melting point is nickel and the metal with a low melting point is zinc.

5. The metal-resin composite according to claim 4, wherein
   one or more of the overhang shapes are formed per 1 μm in the parallel direction of the interface.

6. The metal-resin composite according to claim 4, wherein the alloy layer further comprises carbon, and a concentration of the carbon within the alloy layer gradually decreases from the first side of the alloy layer toward the second side of the alloy layer.

* * * * *